United States Patent [19]
Murata et al.

[11] Patent Number: 5,504,029
[45] Date of Patent: Apr. 2, 1996

[54] METHOD OF PRODUCING SEMICONDUCTOR INTEGRATED CIRCUIT DEVICE HAVING MEMORY CELL AND PERIPHERAL CIRCUIT MISFETS

[75] Inventors: Jun Murata, Kunitachi; Yoshitaka Tadaki; Isamu Asano, both of Ohme; Mitsuaki Horiuchi, Hachioji; Jun Sugiura, Musashino; Hiroko Kaneko, Higashimurayama; Shinji Shimizu, Houya; Atsushi Hiraiwa, Kodaira; Hidetsugu Ogishi, Hachioji; Masakazu Sagawa, Ohme; Masami Ozawa, Ohme; Toshihiro Sekiguchi, Ohme, all of Japan

[73] Assignee: Hitachi, Ltd., Tokyo, Japan

[21] Appl. No.: 254,562

[22] Filed: Jun. 6, 1994

Related U.S. Application Data

[62] Division of Ser. No. 894,351, Jun. 4, 1992, abandoned, which is a division of Ser. No. 246,514, Sep. 19, 1988, Pat. No. 5,153,685.

[30] Foreign Application Priority Data

| Sep. 19, 1987 | [JP] | Japan | 62-235906 |
| Sep. 19, 1987 | [JP] | Japan | 62-235909 |
| Sep. 19, 1987 | [JP] | Japan | 62-235910 |
| Sep. 19, 1987 | [JP] | Japan | 62-235911 |
| Sep. 19, 1987 | [JP] | Japan | 62-235912 |
| Sep. 19, 1987 | [JP] | Japan | 62-235913 |
| Sep. 19, 1987 | [JP] | Japan | 62-235914 |

[51] Int. Cl.$^6$ .................... H01L 21/70; H01L 27/00
[52] U.S. Cl. ................................. 437/52; 437/47
[58] Field of Search ............... 437/47, 52, 60, 437/919

[56] References Cited

U.S. PATENT DOCUMENTS

| 4,355,374 | 10/1982 | Sakai et al. | 365/149 |
| 4,577,390 | 3/1986 | Haken | 29/570 |
| 4,882,289 | 11/1989 | Moriuchi et al. | 437/52 |
| 4,994,889 | 2/1991 | Takeuchi et al. | 257/296 |

Primary Examiner—George Fourson
Assistant Examiner—H. Jey Tsai
Attorney, Agent, or Firm—Antonelli, Terry, Stout & Kraus

[57] ABSTRACT

A semiconductor integrated circuit device having a switching MISFET, and a capacitor element formed over the semiconductor substrate, is disclosed. The impurity concentration of the semiconductor region of the switching MISFET to which the capacitor element is connected is less than the impurity concentration of semiconductor regions of MISFETs of peripheral circuitry. The Y-select signal line overlaps the lower electrode layer of the capacitor element. A potential barrier layer, provided at least under the semiconductor region of the switching MISFET to which the capacitor element is connected, is formed by diffusion of an impurity for a channel stopper region. The dielectric film of the capacitor element is co-extensive with the capacitor electrode layer over it. The capacitor dielectric film is a silicon nitride film having a silicon oxide layer thereon, the silicon oxide layer being formed by oxidizing a surface layer of the silicon nitride under high pressure. An aluminum wiring layer and a protective (and/or barrier) layer are formed by sputtering in the same vacuum sputtering chamber without breaking the vacuum between forming the layers; and a refractory metal, or a refractory metal silicide $QSi_x$, where Q is a refractory metal and x is between 0 and 2, is used as a protective layer, for an aluminum wiring containing an added element (e.g., Cu) to prevent migration.

23 Claims, 21 Drawing Sheets

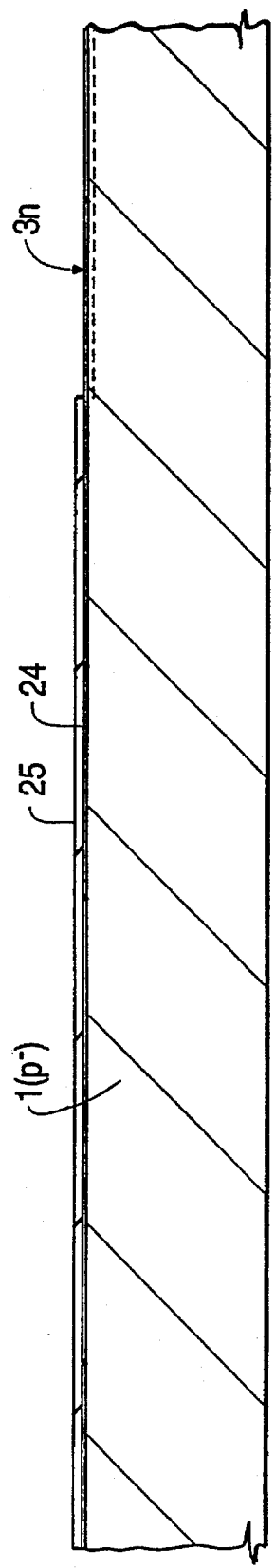
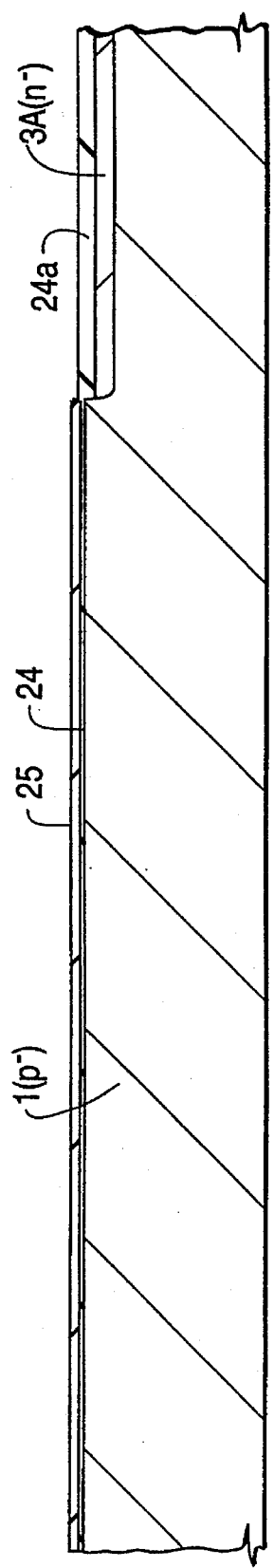
FIG. 9
FIG. 10

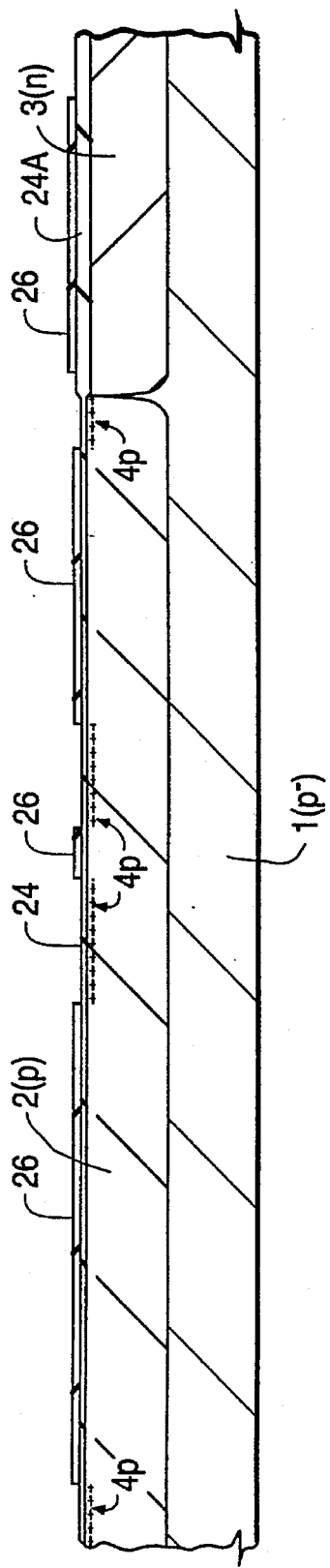
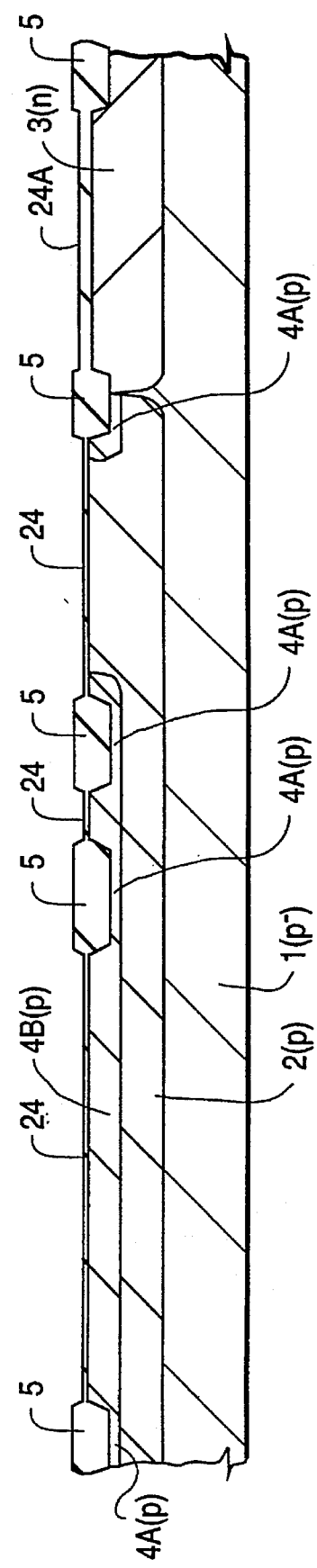

METHOD OF PRODUCING SEMICONDUCTOR INTEGRATED CIRCUIT DEVICE HAVING MEMORY CELL AND PERIPHERAL CIRCUIT MISFETS

This is a divisional application of application Ser. No. 07/894,351, filed Jun. 4, 1992, abandoned which is a divisional application of application Ser. No. 07/246,514, filed Sep. 19, 1988 U.S. Pat. No. 5,153,685.

BACKGROUND OF THE INVENTION

The present invention relates to a semiconductor integrated circuit device, particularly a semiconductor integrated circuit memory device, and more particularly to structure which is effective when applied to a semiconductor integrated circuit device having dynamic random access memories (DRAMs), and methods for the production thereof. The present invention is further directed to a semiconductor integrated circuit device having a capacitor element, particularly a semiconductor integrated circuit memory device, such as a DRAM, having a stacked capacitor element, and methods of production thereof.

The present invention is further directed to wiring techniques having applicability in connection with various devices, including in connection with semiconductor integrated circuit devices, particularly semiconductor integrated circuit memory devices such as DRAMs.

Each of the memory cells constituting a DRAM includes a memory cell selecting MISFET and a capacitor element for storing information, such capacitor element being connected in series to one semiconductor region of the MISFET. The gate electrode of the memory cell selecting MISFET is connected to a word line which extends in the row direction so that the MISFET is controlled through this word line. The other semiconductor region of the memory cell selecting MISFET is connected to a data line which extends in the column direction.

Attempts are continuously being made, with respect to this type of DRAM, to increase its integration density, for the purpose of increasing the memory capacity, and therefore there is a tendency for the memory cell sizes to shrink. When the memory cell sizes are reduced, the size (area) of the capacitor elements, for storing the information, is also reduced which results in a decrease in the capacity of such capacitor elements for storing charges which constitute information. As the charge storing capacity decreases, the effect of minority carriers generated due to α-particles increases, so that so-called soft errors are likely to occur. This occurrence of soft errors is particularly a problem in DRAMs having high integration density, such as 1 Mbit or more.

In view of this problem of soft errors generated due to α-particles, stacked capacitor elements (STCs) have been adopted as information storage capacitor elements of the memory cells of DRAMs. A stacked capacitor element includes a first electrode layer, a dielectric film and a second electrode layer, which are successively stacked on a semiconductor substrate. The first electrode layer is formed in such a manner that, after memory cell selecting MISFETs of the memory cells have been formed, when part of the first electrode layer of the stacked capacitor elements is connected to one semiconductor region of the corresponding MISFET, another part thereof is extended above the gate electrode of the corresponding memory cell selecting MISFET. The first electrode layer is formed from a polycrystalline silicon film having an impurity (such as P or As, for example) introduced therein, for the purpose of lowering the resistance value of the polycrystalline silicon. The dielectric film is defined by a silicon oxide film formed by oxidizing the surface of the polycrystalline silicon film constituting the first electrode layer, The second electrode layer is formed integrally with the second electrode layers of other adjacent memory cells, thus providing a common plate electrode (as the second electrode layer). The second electrode layer is formed from a polycrystalline silicon film like that of the first electrode layer.

The aforementioned memory cell selecting MISFET of the memory cell is constructed into an n-channel type. This MISFET has its shape specified by the element insulating isolating film and a p-type channel stopper region, and is electrically isolated from the elements of other regions.

There is connected a data line with the other semiconductor region of the memory cell selecting MISFET of each memory cell in the array, such data line being connected to such other semiconductor region through an intermediate conducting layer which is formed in the same fabrication step as the first electrode layer of the storage capacitor element. Since this intermediate conducting layer is connected in self-alignment with the other semiconductor region, the data line is connected in self-alignment with the other semiconductor region even if a masking-displacement is caused at the fabrication steps of the intermediate conducting layer and the data line.

Information stored in each memory cell of the DRAM is input through the above-described data line to a sense amplifier of a peripheral circuit, where it is amplified, and the amplified information is then output to a common data line through a Y-switch. The Y-switch is controlled by a column decoder circuit (Y-decoder circuit) through a Y-select signal line. The Y-select signal line is formed from the same conductive layer as that for the above-described data line and extends in the same column direction as the data line.

The memory cell comprising the above-described stacked capacitor elements has the advantage that incidence of soft errors can be reduced because such capacitor elements do not use the semiconductor substrate in which minority carriers are generated due to α-particles incident thereon. In addition, the stacked capacitor element enables areas of the first and second electrode layers to be increased in the heightwise direction (direction extending perpendicular to the semiconductor substrate) by making use of the stepped configuration of the memory cell selecting MISFET. Due to such increased size, an increase in the capacity of storing charge which constitutes information is achieved, so that it is further possible to reduce soft errors.

The data lines of the DRAMs, mentioned previously, consist of an aluminum wiring having a small specific resistivity. An element for reducing electromigration and stress migration is added to the aluminum wiring forming the data line. For example, copper (Cu) is generally used as such element for reducing electromigration and stress migration; however, palladium (Pd) or titanium (Ti) can also be used as such element. In addition, silicon or the like has also been added to the aluminum wiring, in addition to the element(s) discussed above, in order to prevent an aluminum spike. Thus, a common wiring for the data line is an aluminum-copper-silicon wiring.

The aluminum wiring technique of a DRAM is described, for example, in "Nikkei Micro-Devices", May Issue, 1987, pgs. 16–31, Special Issue No. 1, published by Nikkei-McGraw-Hill Co.

It should also be noted that a DRAM in which each memory cell includes a stacked capacitor element is described, for example, in Japanese Patent Laid-Open No. 183952/1986. The contents of this Japanese patent laid-open application are incorporated in their entirety herein.

SUMMARY OF THE INVENTION

Problems Found and Addressed by the Inventors

In attempting to develop a DRAM having increased capacity, the present inventors have found various problems in the above-described prior art structure, and in the methods of forming such structure.

A. In connection with a first aspect of the present invention, the inventors have found that when the information storage capacitor of the stacked structure is formed after the memory cell selecting MISFET has been formed, the source and drain region of the MISFET being formed by ion implantation at a relative high implantation flux of or above $10^{15}$ atoms/cm$^2$ (providing a high impurity concentration region of or above $10^{20}$ atoms/cm$^3$), crystal defects are often caused in the principal surface portion of the semiconductor substrate (for example, a well region formed in the substrate) due to such ion implantation. Such crystal defects cannot be satisfactorily removed by annealing at a later step in the manufacturing process. Due to such defects, charges stored in the stacked capacitor element leak to the substrate, so that the information retention characteristics of the DRAM degrade. Such degradation of the information retention characteristics results in the requirement that the frequency of refreshing the information increases, so that the operating speed of the DRAM decreases.

B. In connection with a second aspect of the present invention, the present inventors have found that, where each of the memory cells is disposed under the above-described data line, and if the aforementioned Y-select signal line is provided using the same conductive layer as that for the data line, the region where this Y-select signal line is provided becomes a useless space. This useless space hinders a decrease in the memory cell area, and results in a failure to further increase the integration density of the DRAM.

C. In connection with a third aspect of the present invention, as the integration density increases, and in order to protect against minority carriers below the memory cell forming region, it becomes desirable to form a potential barrier layer below the memory cell forming region. This potential barrier layer can be formed, for example, by introducing a P-type impurity at a high dosage into the memory cell forming region by ion implantation. This P-type impurity can be introduced at various stages during the manufacturing process. Thus, this P-type impurity can be introduced into the entire surface of the memory cell array, including locations for the memory cell, before the element isolating insulating film and the channel stopper region are formed. In addition, this introduction of the P-type impurity can be accomplished by using the element isolating insulating film as an impurity introducing mask, after the element isolating insulating film and the channel stopper region are formed.

The introduction of the P-type impurity for forming the potential barrier layer increases the impurity concentration of the aforementioned channel stopper region in the peripheral region of the memory cell. This increase in turn drops the PN junction breakdown strength between one semiconductor region (forming part of the information storing capacitor element, that is, a storage node) of the MISFET of a memory cell and the channel stopper region. This drop in the junction breakdown strength causes the electric charges stored in the stacked capacitor element to leak, thereby degrading its information holding characteristics, so that the frequency of refreshing such information is increased. As a result, the reading and writing rates of the DRAM increases, thus decreasing the speed of the DRAM. Moreover, such DRAM, having such potential barrier layer, requires an increased number of fabrication steps, due to the addition of the step of forming the aforementioned potential barrier layer.

As a technique for solving the problems specified above, in connection with this third aspect of the present invention, it is possible to form both the channel stopper region and the potential barrier layer in the same processing step, with the channel stopper region being formed by introducing a P-type impurity through the element isolating insulating film by ion implantation using a high energy. If, however, the impurity is introduced with a high energy, a number of crystal defects is caused in the substrate surface at the memory cell forming region, thereby degrading the information holding characteristics of the DRAM.

D. In connection with a fourth aspect of the present invention, the inventors have found the following problems arising upon increasing the integration density of the DRAM. Thus, the memory cell is required to have an isolating space between the first electrode layer of the stacked capacitor element and an intermediate conducting layer which connects a data line to a semiconductor region of the memory cell selecting MISFET. Such isolating space causes a decrease in the area of the first electrode layer of the stacked capacitor element, and accordingly decreases the amount of storage of electrical charges which can be achieved in the stacked capacitor element. Moreover, when the second electrode layer of the stacked capacitor element is to be patterned, the intermediate conducting layer uses a dielectric film formed thereover as an etching stopper; however, since this dielectric film is very thin, the intermediate conducting layer can be damaged or broken as a result of over-etching in patterning the second electrode layer. This causes a poor connection between the data line and the other semiconductor region of the MISFET.

In order to prevent this, it is conceivable not to sandwich an intermediate conducting layer between the other semiconductor region and the data line. The omission of the intermediate conducting layer can extend the first electrode layer to the data line, so as to increase the area of the same, so that the amount of storage of the electric charges of the stacked capacitor element can be increased. However, since the other semiconductor region has its principal surface substantially exposed to the outside, when the intermediate conducting layer is omitted, its principal surface is damaged by the etching upon patterning the first and second electrode layers of the stacked capacitor element.

In order to solve this problem, an inter-layer insulating film can be formed as an etching stopper layer all over the surface of the substrate after the MISFET is formed and before forming the first electrode layer; such inter-layer insulating film can be made of a silicon oxide film which is prepared by a deposition technique, such as chemical vapor deposition (CVD). The first electrode layer is then formed over the inter-layer insulating film, and the connection between the one semiconductor region of the memory cell selecting MISFET and the first electrode layer of stacked capacitor element can be accomplished through a connection hole which is formed in the aforementioned inter-layer insulating film. However, the inter-layer insulating film over the other semiconductor region of the memory cell selecting MISFET has to be removed before the data line is connected, so that there arises the problem that the number of manufacturing steps for forming the semiconductor device disadvantageously increases. Furthermore, since the removal of the inter-layer insulating film requires a mask alignment margin, there arises a further problem, in connection with use of the inter-layer insulating film, that the memory cell area is disadvantageously increased, so as to decrease the degree of integration of the device.

On the other hand, where the dielectric film of the stacked capacitor element is used as an etching stopper when the second electrode layer is patterned, and when patterning of the second electrode layer is accomplished by plasma etching, for example, the further problem arises that the dielectric film left uncovered by the second electrode layer is charged up with electric charges during patterning of the second electrode layer, so that its dielectric breakdown strength decreases; this deteriorates the reliability of the DRAM. Accordingly, according to this fourth aspect of the present invention, it is desired to provide a technique wherein the integration density of the DRAM can be increased without deteriorating the reliability of the DRAM, while still satisfactorily providing the stacked capacitor element and data line connection to the other semiconductor region of the memory cell selecting MISFET.

E. In connection with a fifth aspect of the present invention, the present inventors have found that the dielectric film of the stacked capacitor element of each of the memory cells, defined by a silicon oxide film formed by oxidizing the surface of a polycrystalline silicon film which defines the first electrode layer, has a lower dielectric strength and a larger number of defects per unit area than those of a silicon oxide film formed by oxidizing the surface of a single crystal silicon substrate. Due to such lower dielectric strength and larger number of defects, the stacked capacitor element has a relatively large leakage current, and therefore suffers from deterioration of information holding characteristics. While it has been considered to adopt a single-layer silicon nitride film, deposited by CVD, as the dielectric film of the stacked capacitor element, such single-layer silicon nitride film has a relatively large leakage current, and therefore the information holding characteristics of the capacitor element having such nitride film as the dielectric layer is deteriorated. Accordingly, there is still a need, according to this fifth aspect of the present invention, to provide a dielectric film of the stacked capacitor element whereby the stacked capacitor element has a relatively small leakage current.

F. In connection with a sixth aspect of the present invention, the inventors have discovered that, in connection with aluminum wiring (such as the data line) used in, e.g., a DRAM, shape defect and disconnection occur frequently due to electrolytic corrosion. As a result of analysis of the aluminum wiring, the inventors believe that such electrolytic corrosion occurs during a wet treatment after forming such wiring. Specifically, the aluminum wiring to which the element for reducing migration is added is formed by anisotropic etching, such as reactive ion etching (RIE) using a photoresist film as an etching mask. After this anisotropic etching step, the aluminum wiring is subjected to water washing and a cleaning treatment, and to a wet treatment, using a liquid, to remove the photoresist film utilized as an etching mask during the anisotropic etching. During this wet treatment, a battery (galvanic) reaction occurs with the base (aluminum) of the aluminum wiring serving as an anode and an intermetallic compound formed by aluminum and the element for reducing electromigration added to the wiring, as described above, serving as a cathode. This galvanic reaction corrodes the base of the wiring around the intermetallic compound as a nucleus, with shape defects or disconnection of the aluminum wiring resulting from this galvanic reaction; such result lowers the electrical reliability of the wiring used in the DRAM.

In order to improve electrical reliability of the aluminum wiring resulting from the galvanic reaction described above, the inventors of the present invention dispose a protective film on the aluminum wiring to protect it from the liquid used in the wet treatment. A refractory metal film or a refractory metal silicide film having resistance to wet treatment, and high reliability in a semiconductor fabrication process, is used as the protective film. This protective film is formed by first depositing an aluminum film by sputtering, by use of a sputtering apparatus, and then depositing the protective film by use of another sputtering apparatus, or a CVD apparatus. However, the inventors have found that an aluminum oxide film is instantaneously formed on the aluminum film, while the formed structure is transferred between, for example, the sputtering apparatus for depositing the aluminum film and another sputtering apparatus, or a CVD apparatus, for forming the protective film. This aluminum oxide functions as an etching stopper when the aluminum film is patterned and results in the problem that the aluminum film cannot be etched. Thus, according to this sixth aspect of the present invention, there is a desire to provide a structure of aluminum film and protective film; without such aluminum oxide film.

G. In connection with a seventh aspect of the present invention, and in order to provide DRAMs having large integration density, applicants have found that when $MoSi_2$ is utilized as the protective film for protecting the aluminum wiring from a liquid used for wet treatment to remove the photoresist mask utilized for anisotropic etching to form the wiring, with an upper layer aluminum wiring being provided on the $MoSi_2$ (for example, such $MoSi_2$ being provided in a through-hole in an inter-layer insulating film to provide electrical conductivity between upper and lower aluminum wiring layers), the contact resistance value increases abnormally at the interface portion between the $MoSi_2$ and the upper aluminum wiring. As a result of analysis, the inventors have found that aluminum particles of the lower layer aluminum wiring precipitate at the interface through $MoSi_2$ and an aluminum oxide is formed at the interface. The increase in contact resistance value between the lower and upper layer aluminum wirings reduce the yield of the through-holes.

Solutions to the Foregoing Problems

A. Accordingly, it is an object of the first aspect of the present invention to provide, in a semiconductor integrated circuit device (e.g., a DRAM), wherein a memory cell is constructed utilizing a capacitor element (e.g., a stacked capacitor element) formed on a substrate, a technique capable of enhancing information retention characteristics of the device.

It is a further object of this first aspect of the present invention to provide a technique of capable of accomplishing the aforementioned object, thereby to raise the operating speed of the DRAM.

It is a still further object of this first aspect of the present invention to provide a technique capable of reducing the area of the memory cell, thereby to increase the integration density of the DRAM.

It is a further object of this first aspect of the present invention to provide a technique capable of lowering the resistance of the connection portion between one of the semiconductor regions of the memory cell selecting MISFET of the memory cell and, e.g., the stacked capacitor element of such memory cell.

It is a still further object of this first aspect of the present invention to provide a technique capable of preventing short-circuiting between a substrate and a data line which is connected to the memory cell selecting MISFET of the memory cell.

The foregoing objects, and other objects, of the first aspect of the present invention are achieved by the presently described structure, which will be briefly summarized in the following. Such summary of this aspect of the present invention, achieving the objects in connection with the first aspect of the present invention, as well as the following summaries in connection with the other aspects of the present invention, are illustrative, and not limiting. Moreover, while these summaries set forth the various aspects of the present invention in terms of DRAMs having stacked capacitor elements, the present invention in all of its aspects is not to be limited thereto.

Thus, in each memory cell of a DRAM, the semiconductor region of the memory cell selecting MISFET to which the stacked capacitor element is connected is formed by ion implantation at an impurity concentration lower than that of the semiconductor regions of the MISFETs of peripheral circuits of such DRAM.

In addition, the semiconductor region of the memory cell selecting MISFET to which the stacked capacitor element is connected is made up of a first semiconductor region of low impurity concentration which is formed by ion implantation, which has formed therein a further semiconductor region of high impurity concentration which is formed by diffusion of an impurity introduced in the electrode layer of the stacked capacitor element, connected to the semiconductor region.

In addition, the other semiconductor region of the memory cell selecting MISFET of the memory cell, electrically connected to a data line, is formed of a semiconductor region of low impurity concentration which is formed by ion implantation, and a still further semiconductor region, of high impurity concentration, which is formed by ion implantation carried out through a contact hole for connecting such other semiconductor region and the data line, is provided in such other semiconductor region.

According to such structure as discussed above, the occurrence of crystal defects in the semiconductor substrate, attributed to ion implantation when forming the semiconductor regions of the memory cell selecting MISFET, can be decreased, and leakage of charges that store information in the stacked capacitor element can be reduced, so that the information retention characteristics of the DRAM can be enhanced. As a result, the frequency of refresh of the DRAM can be reduced, whereby the operating speed of the DRAM can be increased.

Furthermore, since the semiconductor region of the memory cell selecting MISFET has a relatively-low impurity concentration, as compared to that of MISFETs of the peripheral circuit, the short channel effect can be suppressed, so that the area of the memory cell can be reduced. As a result, a higher integration density of the DRAM can be achieved. Furthermore, through use of diffusing the impurity from the electrode layer of the stacked capacitor element into the semiconductor region of the memory cell selecting MISFET, the contact resistance therebetween can be reduced.

Furthermore, since the semiconductor region of the memory cell selecting MISFET in contact with the data line is formed in part by ion implantation through a contact hole for the data line to be connected therewith, short-circuiting of the data line and the substrate attributed to mask misregistration between the other semiconductor region of the memory cell selecting MISFET and the data line can be avoided.

B. In connection with the second aspect of the present invention, it is an object to provide a technique which enables an increase in the integration density of, e.g., a DRAM in which each memory cell includes an information storing capacitor element over a substrate (e.g., a stacked capacitor element).

It is a further object of this second aspect of the present invention to provide a technique which enables effective utilization of space where select signal lines extend, in a DRAM utilizing a select signal line formed of the same conductive layer as the data line.

It is a still further object of this second aspect of the present invention to provide a technique which enables an increase in the charge storage capacity of each stacked capacitor element in such a DRAM utilizing the select signal lines.

It is a still further object of this second aspect of the present invention to provide a technique which achieves reduction in the incidence of soft errors in, e.g., a DRAM utilizing such select signal lines.

The foregoing objects are achieved by the second aspect of the present invention, providing structure wherein each memory cell includes a stacked information storage capacitor element, a pair of complementary data lines and a select signal line for selecting the data line, with the data lines and select signal line being formed from the same conductive layer and extending in the same column direction, and wherein the lower electrode layer of the stacked capacitor element is extended to a position where it is overlapped by the select signal line.

By utilizing such structure wherein the lower electrode layer of the, e.g., stacked capacitor element is overlapped by the select signal line, it is possible to increase the area of the lower electrode layer by making use of the space below the select signal line, whereby it is possible to increase the charge storing capacity of, e.g., the stacked capacitor element. Such increase in the charge storage capacity enables a decrease in the incidence of soft errors in the DRAM to be achieved. Furthermore, since the incidence of soft errors can be reduced, it is possible to increase the integration density of the DRAM.

C. In connection with the third aspect of the present invention, it is an object to provide a technique capable of improving the information holding characteristics of the memory device (e.g., DRAM).

It is a further object of this third aspect of the present invention to provide a technique capable of increasing the operating speed of the DRAM.

It is a still further object of this third aspect of the present invention to provide a technique capable of increasing the integration density of the DRAM.

It is a still further object of this third aspect of the present invention to provide a technique capable of reducing the number of steps of fabricating the DRAM.

The foregoing objects of the third aspect of the present invention are achieved by the following technique.

Thus, in a DRAM, there is disposed below the semiconductor region of the memory cell selecting MISFET, to be connected with the stacked capacitor element, a potential barrier layer, which is formed by diffusing an impurity for forming a channel stopper region. In such DRAM, it is particularly advantageous that such potential barrier layer, formed by diffusing an impurity for forming a channel stopper region, is provided below both semiconductor regions of the memory cell selecting MISFET.

Furthermore, the objectives of this third aspect of the present invention are further achieved by forming the channel stopper region and potential barrier layer in the same manufacturing step.

By forming such potential barrier layer as in this third aspect of the present invention, the minority carriers trapped by the capacitor element of the memory cell can be reduced, so that it is possible to prevent soft error of the memory cell mode. Moreover, by such third aspect of the present invention, the impurity concentrations of the channel stopper region and the potential barrier layer can be made substantially equal, to improve the PN junction breakdown voltage between the potential barrier layer and the semiconductor region to which the electrode of the stacked capacitor cell is connected, so that leakage of electrical charges of the stacked capacitor element (whereby information of the stacked capacitor element is lost) can be reduced, to improve the information holding characteristics. As a result, the frequency required to refresh information in the DRAM can be reduced, thereby to increase the operating speed of the DRAM.

In addition, by providing the potential barrier layer beneath the semiconductor region of the memory cell selecting MISFET to which the data line is connected, it is possible to prevent soft error of the data line mode.

Furthermore, since the step of forming the potential barrier layer is performed simultaneously with the step of forming the channel stopper region, it becomes possible to reduce the number of steps for fabricating the DRAM. Moreover, since the potential barrier layer is formed in self-alignment with the channel stopper region, the mask alignment margin of the fabrication process can be eliminated, which can improve the degree of integration of the DRAM.

Furthermore, since diffusion of the impurity introduced for forming the channel stopper region is utilized for forming the potential barrier layer, damage to the substrate caused by ion implantation to introduce the impurity for forming the channel stopper region can be reduced, so as to reduce the crystal defects caused by the impurity introduction. As a result, it is possible to improve the refreshing characteristics of the DRAM.

D. In accordance with the fourth aspect of the present invention, it is an object to provide a technique of improving the breakdown strength of the dielectric film of the memory device (e.g., DRAM) which utilizes, e.g., a stacked capacitor element for storage of information.

It is a further object of this fourth aspect of the present invention to provide a technique capable of improving the electrical reliability of the DRAM.

It is a further object of this fourth aspect of the present invention to provide a technique capable of highly integrating the DRAM by reducing the area of the memory cell.

It is still another object of this fourth aspect of the present invention to provide a technique capable of reducing the number of steps of fabricating the DRAM.

Each of the foregoing objects are achieved by the structure of this fourth aspect of the present invention, which will be summarized below. Generally, the stacked capacitor element of this fourth aspect of the present invention has a dielectric film thereof constructed to have the same shape as that of the second electrode layer, which lies thereover.

In addition, an inter-layer insulating film is removed from the semiconductor region of the memory cell selecting MISFET which is to be connected with the data line, by using the second electrode layer or its patterning mask as a mask in such removal.

By the technique specified in the foregoing, in connection with this fourth aspect of the present invention, the dielectric film of the stacked capacitor element can be coated (laminated) with the second electrode layer to reduce electrical charges stored in the dielectric film (for example, at the time of plasma etching to form the second electrode layer), so that the insulating breakdown voltage of the dielectric film can be improved. As a result, it is possible to improve the electrical reliability of the DRAM.

Furthermore, by this fourth aspect of the invention, the inter-layer insulating film over the semiconductor region of the memory cell selecting MISFET to be connected to the data line can be removed by using the second electrode layer, or its patterning mask, as a mask, so that the number of steps of fabricating the DRAM can be reduced. Furthermore, such removal of the inter-layer insulating film can be accomplished in self-alignment with respect to the second electrode layer or its patterning mask, so that the area of the memory cell can be reduced so as to improve the integration density of the DRAM.

E. In accordance with the fifth aspect of the present invention, it is an object to provide a technique which enables an improvement in the information holding characteristics of a memory device (e.g., a DRAM) having a capacitor element over the substrate (e.g., a stacked capacitor element).

It is a further object of this fifth aspect of the present invention to provide a technique which permits enhancement in the dielectric strength of the dielectric film of the stacked capacitor element of the DRAM, and also permits a reduction in the number of defects per unit area thereof.

It is still another object of this fifth aspect of the present invention to provide a technique which permits reduction in the time required to complete a heat treatment carried out to form the dielectric film of the stacked capacitor element.

It is a still further object of this fifth aspect of the present invention to provide a technique which achieves an increase in the integration density of such DRAM having a stacked capacitor element.

The foregoing objects are achieved by the presently described structure and process for forming such structure. Briefly, a dielectric film of the stacked capacitor element is comprised of a silicon nitride (e.g., $Si_3N_4$) film deposited on the first electrode layer, with a silicon oxide film formed on the silicon nitride film, such silicon oxide film being formed by subjecting the surface of the silicon nitride film to high-pressure oxidation. Thereafter, a second electrode layer is provided on the dielectric film. By the above-described structure, and process of forming such structure, wherein a silicon oxide film, formed by high-pressure oxidation of a silicon nitride film, is utilized as part of the dielectric film of the stacked capacitor cell, it is possible to form a dielectric film, including a silicon nitride film, having a uniform thickness independently of the crystalline state and configuration of the surface of the underlying first electrode layer, and to form a silicon oxide film of good quality on the silicon nitride film. Accordingly, it is possible to improve the dielectric strength of the dielectric film, reduce the number of defects per unit area of the dielectric film, and minimize the leakage current; it is also possible to reduce the time required for forming the silicon oxide film on the silicon nitride film. Thus, since the silicon oxide is formed at high pressures, the time period necessary for forming the oxide is reduced. Furthermore, since the time required to form the silicon oxide film of the dielectric film is reduced, the junction depth of semiconductor regions such as source and drain regions of MISFETs is reduced, so that the sizes of the elements are reduced, whereby integration density can be increased.

F. According to the sixth aspect of the present invention, it is an object to provide a technique which can prevent formation of an oxide on the surface of a metal wiring (for example, of aluminum) of a lower layer, in a wiring technique which utilizes a metal wiring having at least a two-layered structure.

It is a further object of this sixth aspect of the present invention, to provide a technique which can reliably provide a shaped wiring.

It is a still further object of this sixth aspect of the present invention to provide an integrated circuit semiconductor device, and a method of utilizing such device, having a metal wiring over the substrate, which metal wiring has a two-layered structure.

It is a still further object of this sixth aspect of the present invention to provide an integrated circuit memory device, such as a DRAM, which uses a metal wiring over the semiconductor substrate, which metal wiring has at least a two-layered structure.

The foregoing objects of this sixth aspect of the present invention are achieved by the technique described as follows. Thus, the above objects are achieved by providing a first metal wiring and a second metal wiring stacked on each other, with the first and second metal wirings being formed continuously inside the same vacuum system, without breaking of such vacuum between forming the first and second metal layers.

According to the procedure of this sixth aspect of the present invention, the second metal wiring can be formed on the surface of the first metal wiring without permitting the surface of the first metal wiring to come in contact with the atmosphere. Accordingly, formation of an oxide on the surface of the first metal wiring can be reduced. As a result, the first metal wiring can be removed (for example, etched) reliably, and the resistivity value of the composite film consisting of the first and second metal wirings can, be reduced.

G. In accordance with the seventh aspect of the present invention, it is an object thereof to provide a technique which restricts the galvanic reaction, and can prevent shape defects and disconnection of the wiring, in forming wiring layers stacked on each other.

It is another object of this seventh aspect of the present invention to provide a technique which can improve the electrical reliability of the wiring.

It is a still further object of the seventh aspect of the present invention to provide a technique which prevents precipitation of an oxide at an interface of an interconnection layer between two wiring layers, and which can reduce the contact resistance value between upper and lower level layer wirings.

It is a still further object of this seventh aspect of the present invention to provide interconnections between upper and lower wiring layers of an integrated circuit device (for example, an integrated circuit memory device such as a DRAM), having wiring layers above the semiconductor substrate, the wiring layers being connected via through-holes, wherein precipitation of an oxide is avoided so as to improve the electrical connection between the upper and lower wiring layers via the through-holes.

The foregoing objects in accordance with this seventh aspect of the present invention are achieved by the present structure, as described in the following.

Thus, in providing the connection between the upper and lower wiring layers, a refractory metal silicide film whose silicon content is greater than 0 but less than 2 (that is, $QSi_x$, where Q is a refractory metal such as Mo, Ta, Ti and W, etc., and $0\times 2$) is disposed between the first aluminum wiring, to which an element for reducing migration is included, and a second aluminum wiring provided as an upper layer with respect to the first aluminum wiring. Furthermore, a protective film, for protecting the first aluminum wiring from a liquid used in processing the wiring, is disposed on the first aluminum wiring to which the element for reducing migration is included.

According to such structure as discussed above, it is possible to prevent particles of the first aluminum wiring from precipitating at the interface between the refractory metal silicide film and the second aluminum wiring, through the refractory metal silicide film, so as to reduce contact resistance between the first and second aluminum wirings. Accordingly, electrical connection via the through-holes (including the yield of devices having such through-holes) can be improved.

Furthermore, since the galvanic reaction of a battery constituted by the first aluminum wiring and the intermetallic compound of aluminum and the element for reducing electromigration, can be prevented during etching or wet treatment, damage of the first aluminum wiring resulting from this galvanic reaction can be prevented.

Accordingly, by all of the foregoing aspects of the present invention, a DRAM having large integration density (for example, at least 1 Mbit), can easily be attained.

BRIEF DESCRIPTION OF THE DRAWINGS

FIGS. 9 to 26 are fragmentary sectional views showing the memory cell array and peripheral circuit of the DRAM in various individual manufacturing steps, respectively;

DETAILED DESCRIPTION OF THE INVENTION

While each of the various aspects of the present invention will be described in connection with a specific embodiment, it will be understood that such description is not intended to limit the invention. On the contrary, the present invention is intended to cover all alterations, modifications and equivalents as may be included within the spirit and scope of the invention, as defined by the present claims.

The present invention, in all of its aspects, springs forth from various problems found and addressed in attempting to provide an integrated circuit semiconductor device, such as a memory device (e.g., a DRAM), formed using a semiconductor material, having increased integration density such as an integration density of at least 1 Mbit. By semiconductor material, we generally mean the semiconductor in which active regions are provided (e.g., semiconductor substrate, well region formed in a substrate, epitaxial layer, etc.). While the specific embodiment is discussed in connection with such a DRAM, all of the various aspects of the present invention are not limited thereto, and can be utilized in corresponding structure, for achieving the purposes as set forth above in connection with each of the aspects of the present invention.

Embodiment of the Invention

Figure 1:
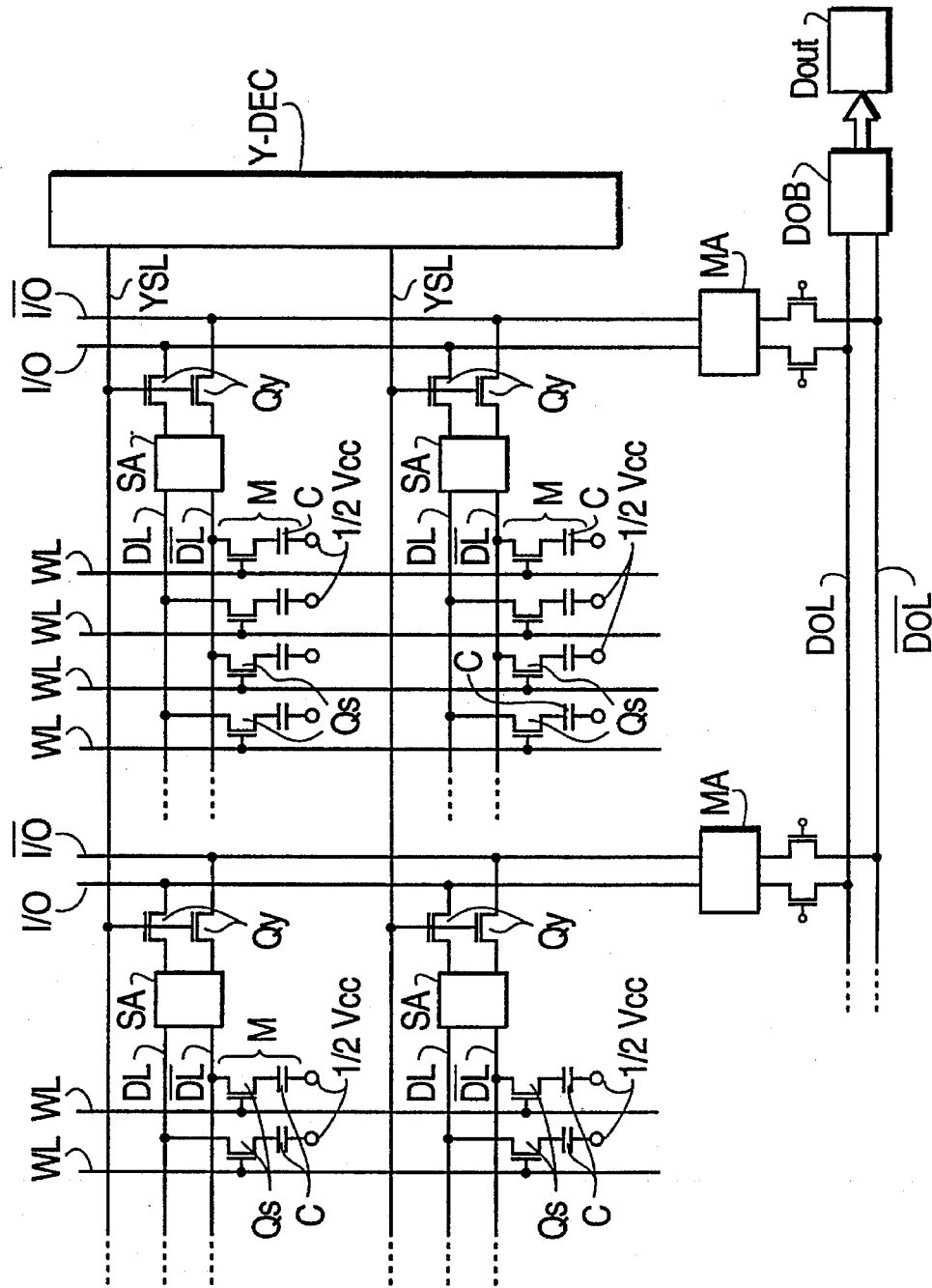
FIG. 1 is an equivalent circuit diagram of a principal part of a DRAM according to one embodiment of the present invention.

The DRAM of large memory capacity which is one embodiment of the present invention is shown in FIG. 1 (an equivalent circuit diagram of principal portions).

As shown in FIG. 1, the DRAM is constructed in the folded bit line organization. A memory cell array (memory cell mats) is arranged centrally of FIG. 1.

The memory cell array has complementary data lines DL and $\overline{DL}$ extended in the direction of columns. The complementary data lines DL and $\overline{DL}$ in a plurality of sets are arranged in the direction of rows. One end side of each set of the complementary data lines DL and $\overline{DL}$ is connected to a sense amplifier SA.

Word lines WL are extended in the row direction intersecting the complementary data lines DL and $\overline{DL}$. A plurality of word lines WL are used, arranged in the column direction. Each of the word lines WL is laid so as to be connected to and selected by a row decoder circuit X-DEC arranged at an end part of the memory cell array, though this circuit is not shown.

A memory cell M for storing information of 1 bit is arranged at the intersection part between each of the complementary data lines DL and $\overline{DL}$ and the word line WL. The memory cell M is constructed of an n-channel MISFET $Q_s$ for selecting this memory cell, and an information storing capacitor C, one electrode of which is connected in series with one of the semiconductor regions of the MISFET.

The MISFET $Q_s$ of the memory cell M has the other semiconductor region thereof connected to one of the complementary data lines DL and $\overline{DL}$, and has the gate electrode thereof connected to the word line WL. The other electrode of the information storing capacitor C is connected to a power source voltage of ½ $V_{cc}$. The power source voltage, ½ $V_{cc}$ is the intermediate potential between the reference voltage $V_{ss}$ (=0 V) of the circuitry and the power source voltage $V_{cc}$ (=5 V) of the circuitry. The power source voltage, ½ $V_{cc}$ applied to the other electrode is adapted to lower an electric field intensity which acts across the electrodes of the information storing capacitor C, and to mitigate degradation in the dielectric strength of the dielectric film of the capacitor.

The sense amplifier SA is constructed so as to amplify the information of the memory cells M which is transmitted by the complementary data lines DL and $\overline{DL}$. The information amplified by the sense amplifier SA is delivered to common data lines I/O and $\overline{I/O}$ through Y-switching n-channel MISFETs $Q_y$.

The Y-switching MISFETs $Q_y$ are so constructed that their gates are connected to and controlled by a Y-select signal line YSL. Each Y-select signal line YSL is laid in correspondence with one set of complementary data lines DL and $\overline{DL}$. The Y-select signal lines YSL are extended in the column direction similarly to the complementary data lines DL and $\overline{DL}$, and are arranged between the adjacent sets of complementary data lines DL and $\overline{DL}$. In other words, the sets of complementary data lines DL and $\overline{DL}$ and the Y-select signal lines YSL are alternately arranged in the row direction. The Y-select signal lines YSL are constructed so as to be connected to and selected by a column decoder circuit Y-DEC which is arranged at an end part of the memory cell array.

The common data lines I/O are connected to main amplifiers MA which are arranged at an end part of the memory cell array. Each main amplifier MA is connected to an output transistor Dout through switching MISFETs (with no symbols assigned thereto), output signal lines DOL and $\overline{DOL}$, and a data output buffer-circuit DoB. That is, the information of the memory cells M amplified by the main amplifier MA is delivered to the output transistor Dout through the output-signal lines DOL and $\overline{DOL}$, data output buffer circuit DoB, etc.

Next, there will be described the concrete structures of elements which constitute the memory cells M of the DRAM and the peripheral circuits (sense amplifiers SA, column decoder circuit Y-DEC, etc.) of the DRAM.

Figure 2:
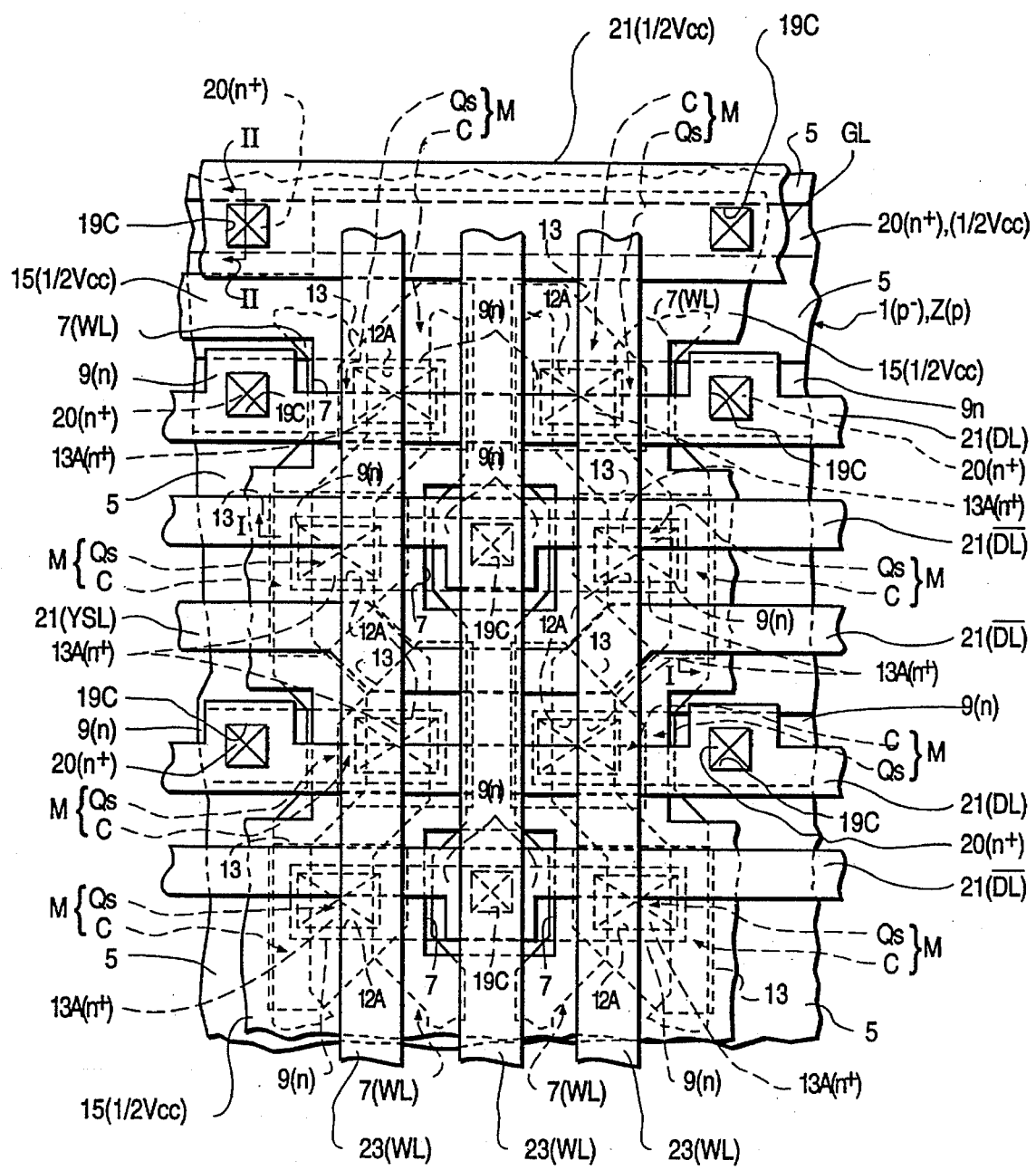
FIG. 2 is a fragmentary plan view of a memory cell array of the DRAM.
Figure 3:
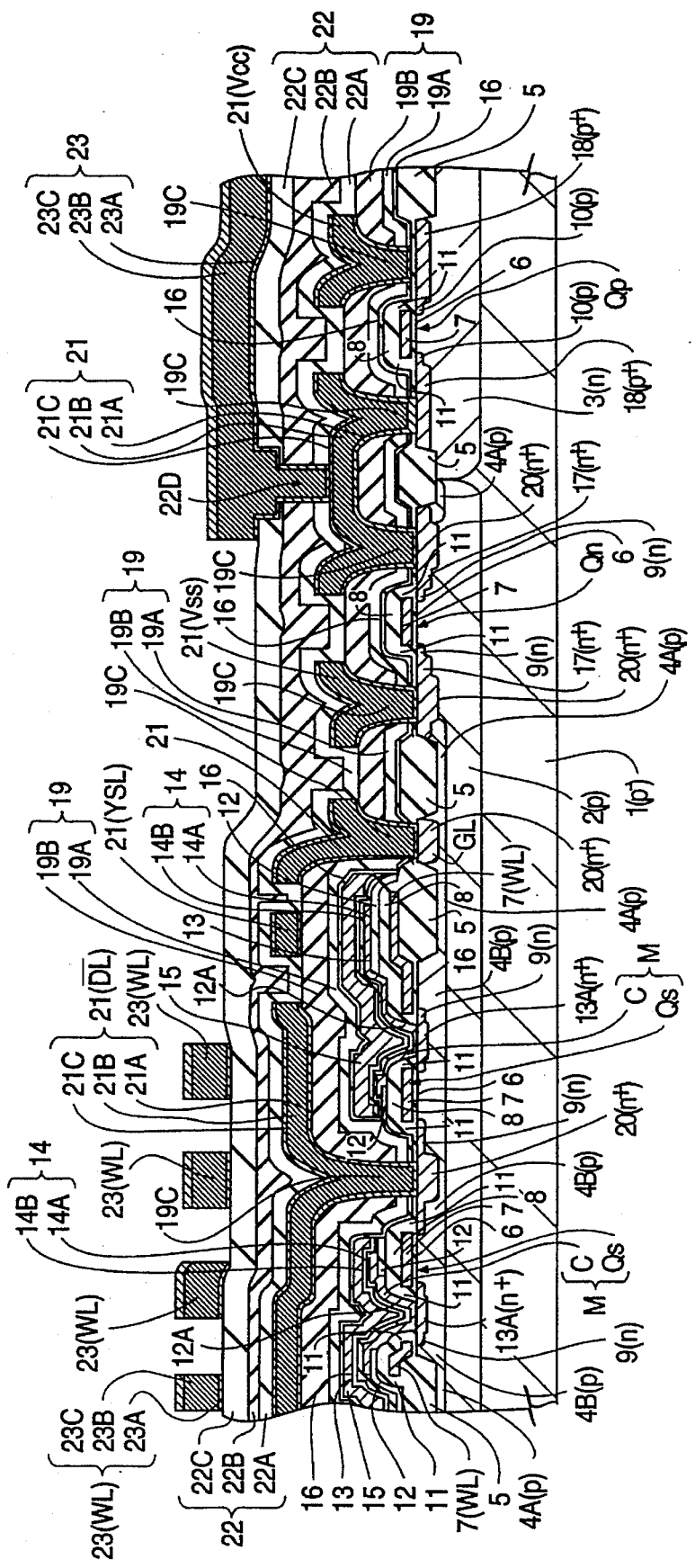
FIG. 3 is a fragmentary sectional view of the memory cell array and peripheral circuit of the DRAM.

The memory cell array of the DRAM is shown in FIG. 2 (a plan view of principal portions), while the elements of the memory cell array and the peripheral circuits are shown in FIG. 3 (a sectional view of principal portions). The left side in FIG. 3 shows the section of the portion of the memory cells M as taken along a cutting-plane line I—I in FIG. 2, and the central part in FIG. 3 shows the section of a guard ring portion as taken along a cutting-plane line II—II in FIG. 2. The right side in FIG. 3 shows the section of complementary MISFETs (CMOS) which constitute the peripheral circuit.

As shown in FIGS. 2 and 3, the DRAM is constructed using a p⁻-type semiconductor substrate 1 made of single-crystal silicon. A p-type well region 2 is provided in the principal surface parts of the memory cell M (memory cell array)-forming region and n-channel MISFET $Q_n$-forming region of the semiconductor substrate 1. An n-type well region 3 is provided in the principal surface part of the p-channel MISFET-forming region $Q_p$ of the semiconductor substrate 1. That is, the DRAM of the present embodiment adopts the twin well structure.

An element isolating insulator film (field insulator film) 5 is provided on the principal surface parts of the well regions 2 and 3 between the regions for forming the individual semiconductor elements. The element isolating insulator film 5 is formed so as to electrically isolate the semiconductor elements. A p-type channel stopper region 4A is provided in the principal surface part of the well region 2 under the element isolating insulator film 5. Since a parasitic MOS whose gate insulator film is the element isolating insulator film 5 is liable to inversion into the n-type, the channel stopper region 4A is provided in the principal surface of at least the well region 2.

A p-type potential barrier layer 4B is provided in the principal surface part of the memory cell M-forming region of the well region 2. The potential barrier layer 4B is provided substantially in the whole surface of the memory cell M-forming region. As will be detailed later, the potential barrier layer 4B is formed by the same manufacturing step and the same manufacturing mask as those of the channel-stopper region 4A. The potential barrier layer 4B is constructed in such a way that a p-type impurity (B) introduced into a channel stopper-forming region in order to form the channel stopper region is brought under the memory cell M-forming region by drive-in diffusion.

Figure 4:
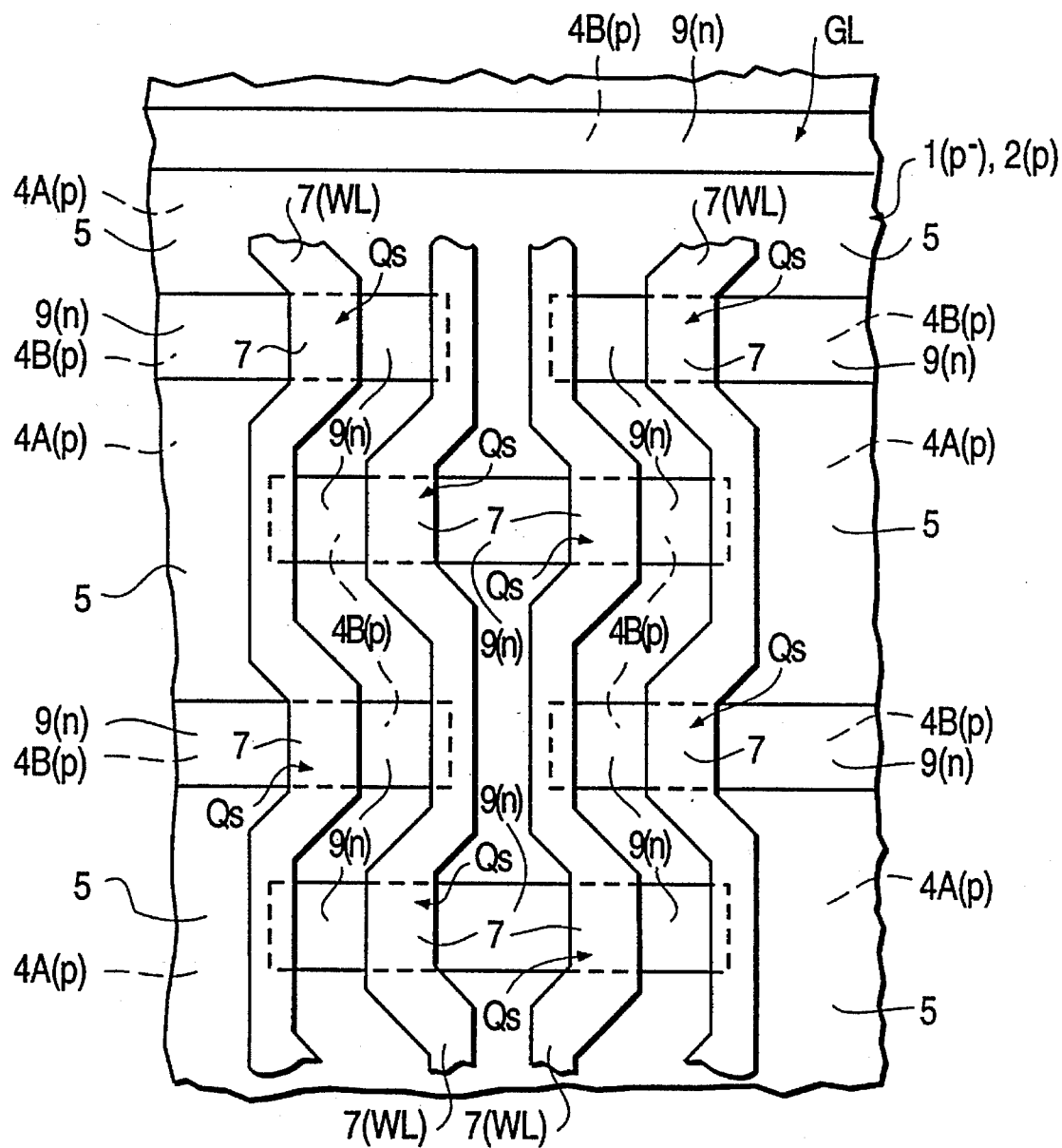
FIGS. 4 and 5 are fragmentary plan views showing the memory cell array in predetermined manufacturing steps, respectively.

As shown in FIG. 2, FIG. 3 and FIG. 4 (a plan view of principal portions at predetermined manufacturing steps), the memory cell selecting MISFETs $Q_s$ of the memory cells M are constructed in the principal surface part of the well region 2 (actually, the potential barrier layer 4B). Each MISFET $Q_s$ has its region surrounded with and its shape defined by the element isolating insulator film 5 and the channel stopper region 4A. Basically, this MISFET $Q_s$ is mainly configured of the well region 2, a gate insulator film 6, a gate electrode 7, and a pair of n-type semiconductor regions 9 which are a source region and a drain region, respectively.

The well region 2 is used as the channel forming region of the MISFET $Q_s$.

The gate insulator film 6 is made of a silicon oxide film formed by oxidizing the principal surface of the well region 2.

The gate electrode 7 is provided on the gate insulator film 6, and is made of a polycrystalline silicon film deposited by CVD by way of example. An n-type impurity (P or As) for lowering a resistance is introduced in this polycrystalline silicon film.

Alternatively, the gate electrode 7 may well be formed of the single layer of a refractory metal (Mo, Ti, Ta or W) film or a refractory metal silicide ($MoSi_2$, $TiSi_2$, $TaSi_2$ or $WSi_2$) film. Further, the gate electrode 7 may well be formed of a composite film in which the above metal film is stacked on a polycrystalline silicon film.

As shown in FIGS. 2 and 4, the gate electrodes 7 are constructed to be integral with the word line (WL) 7 which extends in the row direction. That is, the gate electrodes 7 and the word line 7 are formed of the same conductor layer. The word line 7 is laid so as to connect the gate electrodes 7 of the respective MISFETs $Q_s$ of the plurality of memory cells M arranged in the row direction.

Regarding the semiconductor regions 9, at least the side (one) to which the information storing capacitor C is connected is formed by ion implantation at an impurity concentration lower than that of the semiconductor regions (17) of a MISFET $Q_n$ constituting the peripheral circuit. Concretely, one of the semiconductor regions 9 is formed by ion implantation at an impurity flux of below $1\times10^{14}$ atoms/cm² (an impurity concentration below $1\times10^{19}$ atoms/cm³). The inventors' basic research has revealed that, with the semiconductor region 9 formed by the ion implantation at the flux below $1\times10^{14}$ atoms/cm², only a small number of crystal defects appear in the principal surface part of the well region 2 due to the introduction of an impurity, and they can be satisfactorily remedied by annealing which is carried out after the introduction of the impurity.

The semiconductor regions 9 are formed in self-alignment to the gate electrode 7. The semiconductor regions 9 construct the MISFET $Q_n$ of the LDD (Lightly Doped Drain) structure because the channel forming region side thereof is made the low impurity concentration.

Figure 5:
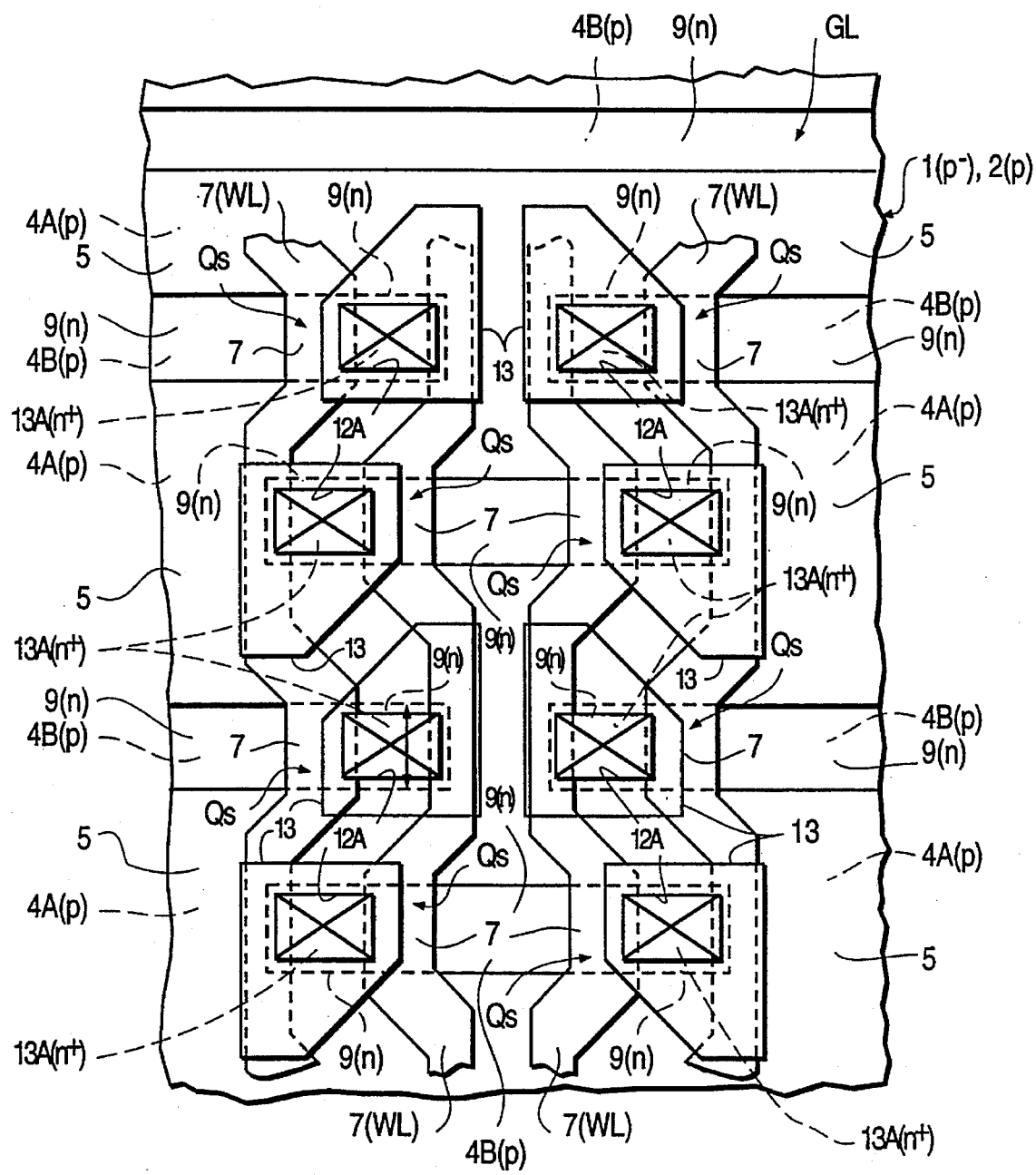

As shown in FIG. 2, FIG. 3 and FIG. 5 (a plan view of principal portions at predetermined manufacturing steps), the information storing capacitor C of the memory cell M is mainly configured of a first electrode layer (lower electrode layer) 13, a dielectric film 14 and a second electrode layer (upper electrode layer) 15 which are stacked in succession. The information storing capacitor C is constructed in the so-called stacked structure (STC).

A part (the central part) of the first electrode layer 13 of the information storing capacitor C of the stacked structure is connected to one semiconductor region 9 of the MISFET $Q_s$. The connection is done through a contact hole 12A which is formed in an inter-layer insulator film 12. The opening size of the contact hole 12A in the column direction is made larger than the length between side-wall spacers 11 which are provided at the respective side walls of the gate electrode 7 of the MISFET $Q_s$ and the word line 7 adjacent thereto. Therefore, the substantial opening size of the contact hole 12A is defined by the length between the side-wall spacers 11. The difference of the opening size of the contact hole 12A and the length between the side-wall spacers 11 is, at least, greater than a component which corresponds to the dimension of a mask registration allowance at a manufacturing step. Other parts (the peripheral parts) of the first electrode layer 13 are respectively extended on the gate electrode 7 and the word line 7 with the side-wall spacers 11 and inter-layer insulator films 8, respectively, interposed therebetween.

The first electrode layer 13 is made of, for example, a polycrystalline silicon film in which an n-type impurity (As or P) for lowering a resistance is introduced at a high concentration. The n-type impurity introduced in the polycrystalline silicon film is diffused to the side of one semiconductor region 9 from the connection part between the first electrode layer 13 and one semiconductor region 9 as defined by the side-wall spacers 11, thereby to form an n⁺-type semiconductor region 13A of high impurity concentration which is integral with the semiconductor region 9.

The other part of the first electrode layer 13 is led out in the row direction (upwards or downwards) from a region defined by one set of complementary data lines (21) DL and $\overline{DL}$. That is, the first electrode layer 13 is led out of the memory cell M-forming region surrounded with the element isolating insulator film 5. The first electrode layer 13 is spaced so as not to come into contact with the first electrode layer 13 (formed of the same conductor layer) of the information storing capacitor C of another memory cell M adjacent in the row direction, and the plan shape thereof is made pentagonal in the present embodiment. The first electrode layer 13 is formed so as to extend to a position where this first electrode layer and the Y-select signal line (21) YSL adjacent in the row direction to the complementary data line (21) DL or $\overline{DL}$ to which the corresponding memory cell M is connected lie one above the other. Since, in actuality, the Y-select signal line (21) YSL overlies the first electrode layer 13, the first electrode layer 13 is formed so as to extend to the position where the Y-select signal line (21) YSL overlaps this first electrode layer.

The dielectric film 14 is basically constructed of a double-layer structure in which a silicon nitride film 14A deposited on the first electrode layer (polycrystalline silicon film) 13 by CVD and a silicon oxide film 14B obtained by oxidizing the silicon nitride film 14A under a high pressure are stacked. Since, in actuality, a natural silicon oxide film is formed on the surface of the polycrystalline silicon film (in which the n-type impurity is introduced) being the first electrode layer 13, the dielectric film 14 is constructed of a triple-layer structure in which the natural silicon oxide film (not shown, because it has a very small thickness less than 50 Å, the silicon nitride film 14A and the silicon oxide film 14B are successively stacked.

Since the silicon nitride film 14A of the dielectric film 14 is deposited by the CVD, it is not affected by the crystal state or stepped shape of the underlying polycrystalline silicon film (first electrode layer 13) and can be formed by process conditions independent of the underlying layer. More specifically, as compared with a silicon oxide film which is formed by oxidizing the surface of the polycrystalline silicon film, the silicon nitride film 14A exhibits a higher dielectric strength and involves a smaller number of defects per unit area, so that it generates a reduced (only a slight) leakage current. Besides, the silicon nitride film 14A has the feature of a higher permittivity over the silicon oxide film. Since the silicon oxide film 14B can be formed into a film of very good quality, the aforementioned characteristics of the silicon nitride film 14A can be further enhanced. In addition, as will be detailed later, the silicon oxide film 14B is formed by high-pressure oxidation (e.g., under 1.5–10 torr) and can therefore be produced in an oxidation time, namely, annealing time shorter than in normal-pressure oxidation.

The dielectric film 14 is provided along the upper surface and side walls of the first electrode layer 13, and acquires an area in the height direction owing to the utilization of the side wall parts of the first electrode layer 13. The increase of the area of the dielectric film 14 can enlarge the quantity of storage of the charges in the information storing capacitor C of the stacked structure. The dielectric film 14 has its plan shape defined by the shape of the overlying second electrode layer 15, and is formed substantially in the same shape as that of the second electrode layer 15.

The second electrode layer 15 is provided on the dielectric film 14 so as to cover the first electrode layer 13 through this dielectric film. The second electrode layer 15 is made integral with the second electrode layer 15 of the information storing capacitor C of another memory cell M adjoining the corresponding memory cell. The second electrode layer 15 is constructed so as to have the power source voltage of ½ $V_{cc}$ applied thereto. It is formed of, for example, a polycrystalline silicon film in which an n-type impurity for lowering a resistance is introduced.

The memory cell M thus constructed is connected with another memory cell M adjacent thereto in the column direction. The connection is effected by integrally forming the other semiconductor regions 9 of the respective memory cell selecting MISFETs $Q_s$ of both the memory cells M.

The complementary data lines (DL and $\overline{DL}$) 21 are connected to the other semiconductor regions 9 of the MISFETs $Q_s$ of the memory cells M. The complementary data lines 21 are connected to the semiconductor regions 9 through a contact hole 19C which is formed in an inter-layer insulator film 19.

As shown in FIGS. 2 and 3, an $n^+$-type semiconductor region 20 of high impurity concentration is provided in the connection part between the complementary data lines 21 and the semiconductor regions 9. The semiconductor region 20 is formed in such a way that an n-type impurity (As or P) is introduced through the contact hole 19C by ion implantation. That is, the semiconductor region 20 is formed to be integral with the semiconductor regions 9. When the contact hole 19C undergoes a mask misregistration at a manufacturing step relative to the semiconductor regions 9 and extends to an end part of the element isolating insulator film 5, the well region 2 and the complementary data lines 21 short-circuit. Therefore, the semiconductor region 20 is provided in order to prevent this drawback.

In the present embodiment, the inter-layer insulator film 19 is constructed of a double-layer structure in which a silicon oxide film 19A, and a silicon oxide film (for example, a boron-phosphosilicate glass (BPSG)) 19B capable of glass flow are stacked. The upper silicon oxide film 19B is so constructed that the surface thereof can be flattened by performing the glass flow. The lower silicon oxide film 19A is provided in order to secure a dielectric strength and to prevent boron (B) and phosphorus (P), contained in the upper silicon oxide film 19B, from leaking to the element.

The complementary data lines 21 are constructed of a triple-layer structure in which a barrier metal film 21A (metal wiring), an aluminum film 21B (metal wiring) and a protective film 21C (metal wiring) are stacked in succession.

The aluminum film 21B is doped with an element for preventing aluminum spikes (Si) and an element for decreasing migration (such as Cu, Pd or Ti). While not limiting, the aluminum film 21B of the present embodiment is formed by adding about 1.5 weight-% of Si and about 0.5 weight-% of Cu.

The barrier metal film 21A is constructed so as to prevent single-crystal silicon from precipitating in the connection part between the aluminum film 21B and the semiconductor region 9 (actually, the semiconductor region 20) and prevent the resistance of this connection part from increasing. The barrier metal film 21A is made of $MoSi_2$. Alternatively, the barrier metal film 21A may well be made of a film of any refractory metal silicide other than the above or a film of refractory metal.

The protective film 21C is constructed so as to protect the aluminum film 21B from a liquid which is used in a wet process for forming the aluminum film 21B (for example, a peeling solution process or a water washing process for removing a photoresist film as an etching mask). The aluminum film 21B doped with the element for mitigating the migration (Cu) forms a cell in which aluminum being the base material thereof acts as an anode, while an intermetallic compound produced by the aluminum and Cu acts as a cathode. The cell gives rise to a galvanic reaction with the liquid which is used in the wet process. The protective film 21C is formed so as to prevent the galvanic reaction. In a case where the galvanic reaction has arisen, the intermetallic compound forms a nucleus, and the surrounding aluminum is scraped off (corrosion takes place).

The protective film 21C is made of $MoSi_x$. Alternatively, the protective film 21C may well be made of a film of any refractory metal silicide ($TiSi_x$, $TaSi_x$ or $WSi_x$) other than the above or a film of refractory metal. It is formed at a small thickness of about 100–4000 Å.

In the case where the protective film 21C is made of the refractory metal silicide film of $MoSi_x$ or the like, aluminum particles diffuse from the aluminum film 21B, depending upon the content of silicon (Si), so that an aluminum oxide ($Al_2O_3$) precipitates on the surface of the protective film 21C. The precipitation of the aluminum oxide causes an inferior contact between the protective film 21C and an overlying wiring layer (23). As the result of the inventors' basic research, the content of silicon in $MoSi_x$ (or the like) for the protective film 21C is set to be greater than 0 and less than 2 ($0<x<2$) as illustrated in FIGS. 6 thru 8 (diagrams showing the compositions of wiring as based on the Auger electron spectrometry).

Figure 6:
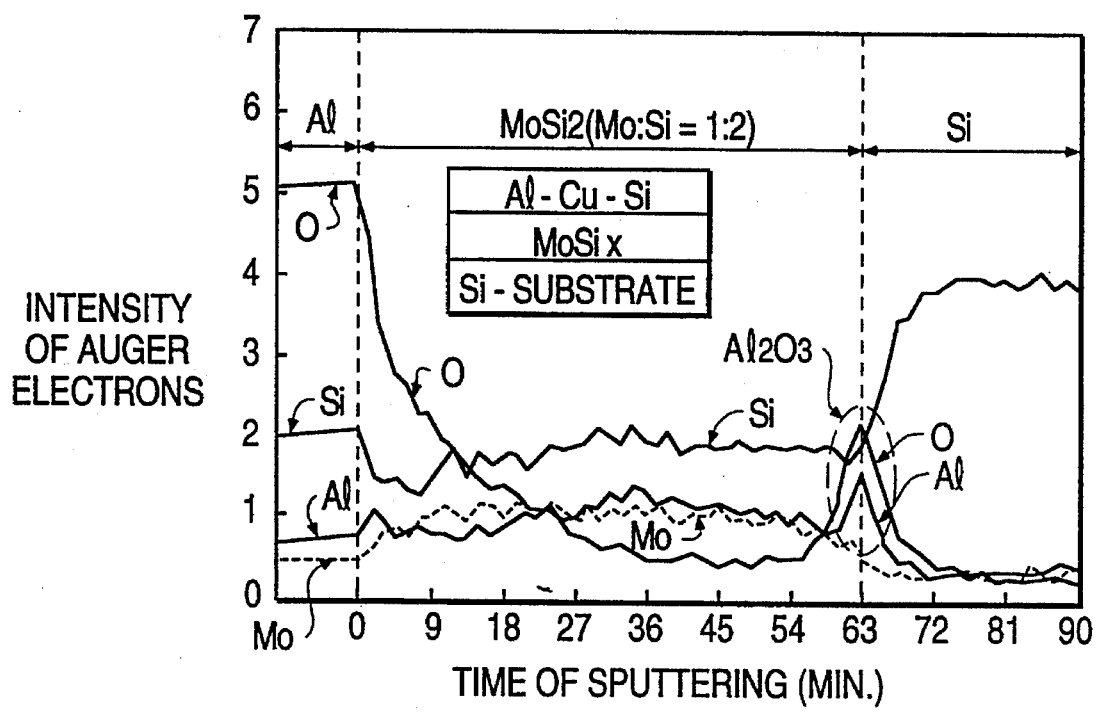
FIGS. 6 to 8 are graphs showing data concerning the compositions of interconnections used in the DRAM measured by Auger electron spectroscopy.
Figure 7:
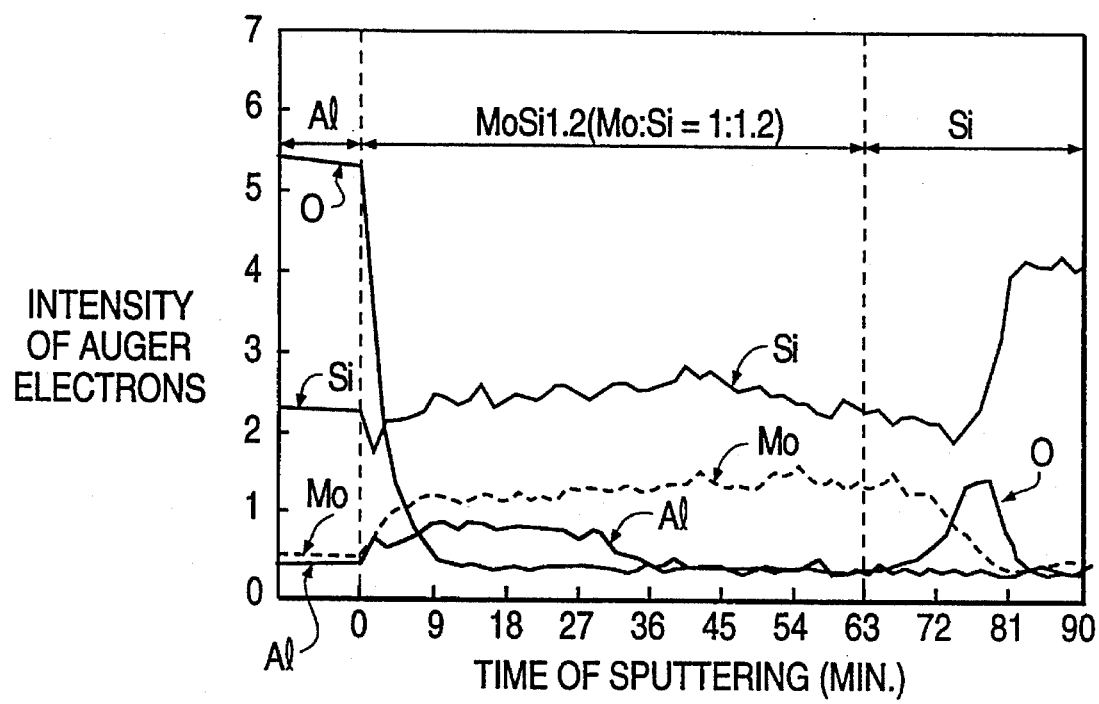
Figure 8:
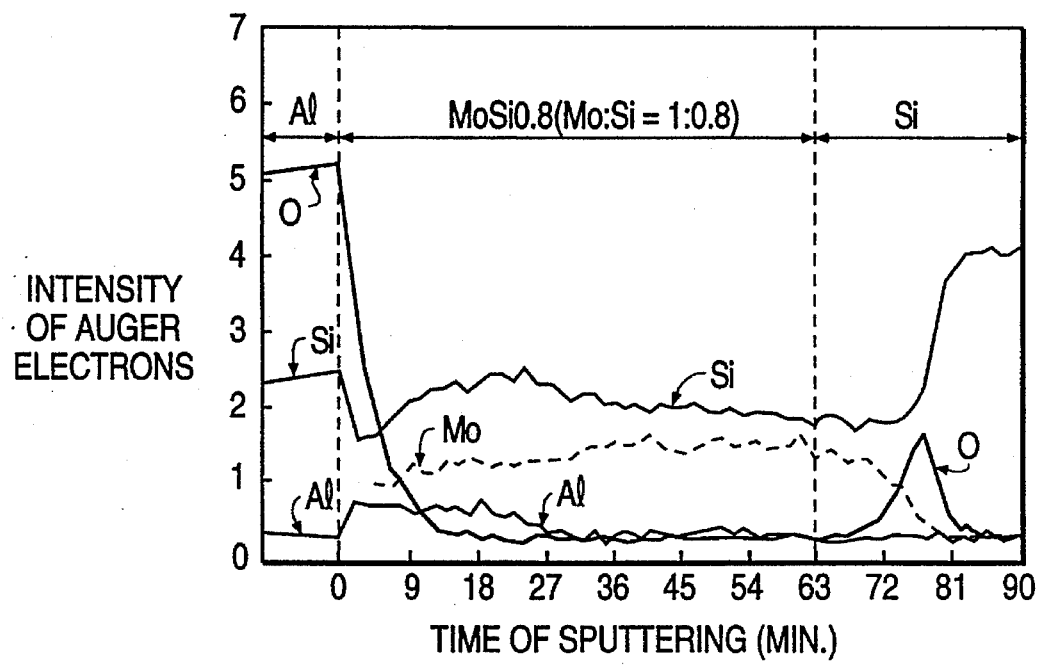

Each of FIGS. 6 thru 8 illustrates data obtained in such a way that samples having a structure specified in FIG. 6 (Al—Cu—Si/$MoSi_x$/Si substrate) were annealed at 475° C. for 3 hours and thereafter had Al—Cu—Si of the upper layers removed with aqua regia, and that the resulting samples were measured by the Auger electron spectrometry. The axis of abscissas represents the period of time min. of sputter etching from the surface of $MoSi_x$. The axis of ordinates represents the intensity of Auger electrons emitted from each of the elements (Mo, Si, O and Al) of the surfaces of the samples in correspondence with various sputtering times. With the Auger electron spectrometry, each time a sample surface is sputter-etched for a predetermined time, the energy of Auger electrons emitted from the sample surface is measured while the sample surface is irradiated with electrons, whereby elements can be identified, and besides, the contents of the elements can be found.

FIG. 6 illustrates the data in the case where the content x of silicon was 2, that is, the metal silicide was $MoSi_2$ (Mo: Si=1: 2). As seen from FIG. 6, in a case where the content x of silicon exceeds 2, aluminum particles having passed through the $MoSi_2$ precipitate at the boundary between the $MoSi_2$ and the Si substrate, and the aluminum particles and oxygen combine to produce the aluminum oxide ($Al_2O_3$).

FIG. 7 illustrates the data in the case where the content x of silicon was less than 2, that is, the metal silicide was $MoSi_{1.2}$ (Mo: Si=1: 1.2), while FIG. 8 illustrates the data in the case where the content x of silicon in the metal silicide was 0.8, that is, the metal silicide was $MoSi_{0.8}$ (Mo: Si=1: 0.8). As shown in FIGS. 7 and 8, in the cases where the content x of silicon is less than 2, the aluminum particles having passed through the $MoSi_x$ do not precipitate at the boundary between the $MoSi_x$ (x =$0<x\leq1.2$) and the Si substrate, and hence, the aluminum oxide is not produced. The inventors' basic research has revealed that the content x of silicon in the protective film 21C should preferably lie in a range greater than 0 and smaller than 1.2.

In the same column direction as the direction in which the complementary data lines (DL and $\overline{DL}$) 21 extend, the Y-select signal line (YSL) 21 formed of the same conductor layer (the same triple-layer structure) is extended. As stated before, the first electrode layer 13 of the information storing capacitor C of the stacked structure is led out so as to be positioned under the Y-select signal line 21.

The complementary data lines 21 and the Y-select signal lines 21 (wiring 21) are formed by the step of forming the first layer of wiring in the manufacturing process. The complementary data lines 21 and the Y-select signal lines 21 which are formed by the step of forming the first layer of wiring, are made thinner than the overlying wiring layer (23) in order to moderate a stepped shape peculiar to a multilayer wiring structure.

As shown in FIGS. 2 and 3, shunting word lines (WL) 23 are laid on the complementary data lines 21 and Y-select signal lines 21 through an inter-layer insulator film 22 so as to extend in the row direction. Although this is not shown in the drawings, the shunting word line 23 is once led down to an intermediate conductor layer (not shown) through the same contact hole 22D as depicted on the right side (in the peripheral circuit) in FIG. 3 and is connected to the intermediate conductor layer, in every predetermined region which corresponds to several tens (for example, 30)–several hundred (for example, 300) memory cells M. The intermediate conductor layers are formed by the step of forming the first layer of wiring, and are connected to the word lines 7 through the contact holes 19C. The shunting word line 23 is constructed so as to lower the resistance of the word line 7. That is, the shunting word line 23 is so constructed that the selection speed of the memory cell M can be raised. The intermediate conductor layer is constructed so as to moderate a stepped shape in the case of connecting the shunting word line 23 and the word line 7, and to prevent the breaking of the shunting word line 23.

As shown in FIG. 3, the inter-layer insulator film 22 is constructed of a triple-layer structure in which a silicon oxide film 22A deposited by plasma CVD, a silicon oxide film 22B formed by coating (for example, by a spin-on technique) and subsequent baking, and a silicon oxide film 22C deposited by plasma CVD are stacked in succession. In the inter-layer insulator film 22, the middle silicon oxide film 22B is formed in order to flatten the surface of the upper silicon oxide film 22C.

The contact hole 22D formed in the inter-layer insulator film 22 has a stair shape in vertical section, in which the opening size of an upper side is large, and that of a lower side is small. Such a stair shape contact hole structure, and process of forming such structure, is described in U.S. patent application Ser. No. 117,855, filed Nov. 6, 1987, the contents of which are incorporated herein in their entirety. The contact hole 22D is provided so as to moderate a stepped shape in the case of connecting the shunting word line 23 and the intermediate conductor layer, and to prevent the breaking of the shunting word line 23.

As shown in FIG. 3, the shunting word line 23 is constructed of a triple-layer structure in which an underlying film 23A and an aluminum film 23B are stacked in succession, with a protective film 23C stacked on aluminum film 23B.

The underlying film 23A is made of $MoSi_2$. The $MoSi_2$ can decrease stress migration because Mo enters the aluminum film 23B and can suppress the growth of the crystal grains of the aluminum film 23B. The underlying film 23A may well be made of a film of any refractory metal silicide other than the above or a film of refractory metal.

Likewise to the aluminum film 21B, the aluminum film 23B is doped with Si and Cu.

Similarly to protective film 21C, protective film 23C is constructed so as to protect aluminum film 23B from a liquid which is used in a wet process for forming aluminum film 23B (for example, a peeling solution process or a water washing process for removing a photoresist film as an etching mask). Note the discussion, with respect to protective film 21C, as to the corrosion of aluminum film 21B which is avoided through use of protective film 21C; use of protective film 23C prevents corresponding corrosion of aluminum film 23B.

The protective film 23C is made of a refractory metal silicide (e.g., $MoSi_x$, $TiSi_x$, $TaSi_x$, $WSi_x$, etc.). As with protective film 21C, the content of silicon (x) in protective film 23C is $0<x<2$, so as to avoid aluminum oxide formation, as discussed previously in connection with protective film 21C.

The shunting word lines 23 are formed by the step of forming the second layer of wiring in the manufacturing process. As compared with the underlying wiring layer (21) formed by the step of forming the first layer of wiring, the shunting word lines 23 which are formed by the step of forming the second layer of wiring are made thicker so as to lower its resistance.

The upper side in FIG. 2 and the central part in FIG. 3 show an end part of the memory cell array, and a guard ring GL is provided at this part. The guard ring GL is formed so as to enclose the memory cell array, and it is constructed so as to capture minority carriers which are chiefly emitted from a substrate bias generator circuit, not shown. The guard ring GL is formed of a semiconductor region 9 provided in the principal surface part of the well region 2, within a region which is defined by the element isolating insulator film 5 and the channel stopper region 4A. The wiring 21 formed by the step of forming the first layer of wiring is connected to the guard ring GL through the contact hole 19C. The power source voltage of ½ $V_{cc}$ is applied to this wiring 21. In addition, the wiring 21 is connected to the second electrode layer 15 through the contact hole 19C so as to apply the power source voltage of ½ $V_{cc}$ thereto.

In this manner, in a DRAM, one set of complementary data lines (DL and $\overline{DL}$) 21 and one Y-select signal line (YSL) 21 for selecting the set of complementary data lines 21 are made of the same conductor layer and are extended in the same column direction, such complementary data lines 21 and Y-select signal lines 21 being alternately arranged in a row direction. Memory cells M, each of which is configured of a MISFET $Q_s$ for selecting the memory cell and an information storing capacitor C of stacked structure connected in series with one of the semiconductor regions 9 of the MISFET, are connected to the complementary data lines 21. A first electrode layer 13 constituting the information storing capacitor C of the stacked structure is extended to a position where this electrode layer and the Y-select signal line 21 adjoining the complementary data line 21 to which the corresponding memory cell M is connected lie one above the other, whereby the area of the first electrode layer 13 of the information storing capacitor C of the stacked structure can be increased by utilizing a space where the Y-select signal line 21 is extended, and hence, the quantity of storage of charges in the information storing capacitor C of the stacked structure can be increased. The first electrode layer 13 of the information storing capacitor C of the stacked structure is not formed in a shape symmetric with respect to the complementary data line 21, but is formed in an asymmetric shape led out under the Y-select signal line 21. The fact that the quantity of storage of charges in the information storing capacitor C of the stacked structure can be increased, makes it possible to diminish soft errors in the memory cell mode of the DRAM. In addition, the fact makes it possible to widen the noise margin of the information readout signals of the DRAM.

CMOS constituting the peripheral circuit are constructed as shown on the right side in FIG. 3. The n-channel MISFET $Q_n$ of the CMOS is formed in the principal surface part of the well region 2, within the region which is surrounded with the element isolating insulator film 5 and the channel stopper region 4A. The MISFET $Q_n$ is mainly configured of the well region 2, a gate insulator film 6, a gate electrode 7, and a pair of n-type semiconductor regions 9 and a pair of $n^+$-type semiconductor regions 17 which form source and drain regions.

The well region 2, the gate insulator film 6, the gate electrode 7 and the semiconductor regions 9 are respectively formed by the same manufacturing steps as those of the memory cell-selecting MISFET $Q_s$, and they have similar functions. That is, the MISFET $Q_n$ is constructed in the LDD structure.

The semiconductor regions 17 of high impurity concentration are constructed so as to lower the respective specific resistances of the source region and the drain region. The semiconductor regions are formed in self-alignment to the gate electrode in such a manner that they are defined by sidewall spacers 11 formed in self-alignment to the side walls of the gate electrode 7.

The wiring 21 to which the reference voltage $v_{ss}$ is applied, is connected through the contact hole 19C to the semiconductor region 17 which is used for the source region. Wiring 21 for an output signal is connected through the contact hole 19C to the semiconductor region 17 which is used for the drain region. A semiconductor region 20 for preventing the short-circuiting between the well region 2 and the wiring 21 is provided in the principal surface part of the well region 2 corresponding to the connection part between the semiconductor region 17 and the wiring 21. These wiring leads are formed by the step of forming the first layer of wiring.

The p-channel MISFET $Q_p$ of the CMOS is formed in the principal surface part of the well region 3, within the region which is surrounded with the element isolating insulator film 5. The MISFET $Q_p$ is mainly configured of the well region 3, a gate insulator film 6, a gate electrode 7, and a pair of p-type semiconductor regions 10 and a pair of $p^+$-type semiconductor regions 18 which are a source region and a drain region.

The well region 3, the gate insulator film 6 and the gate electrode 7 have functions substantially similar to those of the corresponding constituents of the MISFET $Q_s$ or $Q_n$, respectively.

The p-type semiconductor regions 10 of low impurity concentration are provided between the $p^+$-type semiconductor regions 18 of high impurity concentration and a channel forming region, and they constitute the MISFET $Q_p$ of LDD structure.

The wiring 21 to which the power source voltage $V_{cc}$ is applied, is connected through the contact hole 19C to the semiconductor region 18 which is used for the source region. Wiring 21 for an output signal, which is laid to be integral with the output signal wiring 21 mentioned before, is connected through the contact hole 19C to the semiconductor region 18 which is used for the drain region. These wiring leads 21 are formed by the step of forming the first layer of wiring.

Wiring 23 for an output signal, formed by the step of forming the second layer of wiring, is connected through the contact hole 22D to the wiring 21 for an output signal.

Next, a concrete method of manufacturing the DRAM will be briefly described with reference to FIGS. 9 thru 26 (sectional views of principal portions showing respective predetermined steps of manufacture).

First, a $p^-$-type semiconductor substrate 1 made of single-crystal silicon is prepared. The semiconductor substrate 1 is constructed so as to have a resistivity of, for example, about 8–12 Ω-cm.

Subsequently, a silicon oxide film 24 is formed on the principal surface of the semiconductor substrate 1. The silicon oxide film 24 is formed by steam oxidation at a high temperature of about 900°–1000° C., and to a thickness of, for example, about 400–500 Å.

Subsequently, an oxidation-impermeable film 25 is formed on the silicon oxide film 24. The oxidation-impermeable film 25 is made of, for example, a silicon nitride film deposited by CVD and is formed to a thickness of, for example, about 400–600 Å.

Subsequently, the selected part of the oxidation-impermeable film 25 corresponding to an n-type well region-forming region is removed, to form an impurity introducing mask and an oxidation-impermeable mask. The selective removal of the oxidation-impermeable film 25 is performed by, for example, photolithography in which etching is carried out with a photoresist film, as conventionally done.

Subsequently, as illustrated in FIG. 9, an n-type impurity 3n is introduced selectively into the principal part of the semiconductor substrate 1 through the silicon oxide film 24 in such a way that the oxidation-impermeable film 25 and the photoresist film (not shown) for patterning it are employed as the impurity introducing mask. The n-type impurity 3n used is, for example, P at an impurity flux on the order of $10^{13}$ atoms/cm$^2$, and is introduced by ion implantation at an energy level of about 120–130 keV.

Subsequently, the photoresist film on the oxidation-impermeable film 25 is removed. Thereafter, as illustrated in FIG. 10, using the oxidation-impermeable film 25 as the oxidation-impermeable mask, the exposed part of the silicon oxide film 24 is grown to form a silicon oxide film 24A. The silicon oxide film 24A is formed on only the n-type well region-forming region. The silicon oxide film 24A is formed by steam oxidation at a high temperature of about 900°–1000° C. so as to finally become a thickness of, for example, about 1100–1200 Å. This silicon oxide film 24A is used as an impurity introducing mask in the case of forming a p-type well region. By the oxidation step of forming the silicon oxide film 24A, the introduced n-type impurity 3n is somewhat diffused, so that an n-type semiconductor region (to finally become the well region) 3A is formed.

Figure 11:
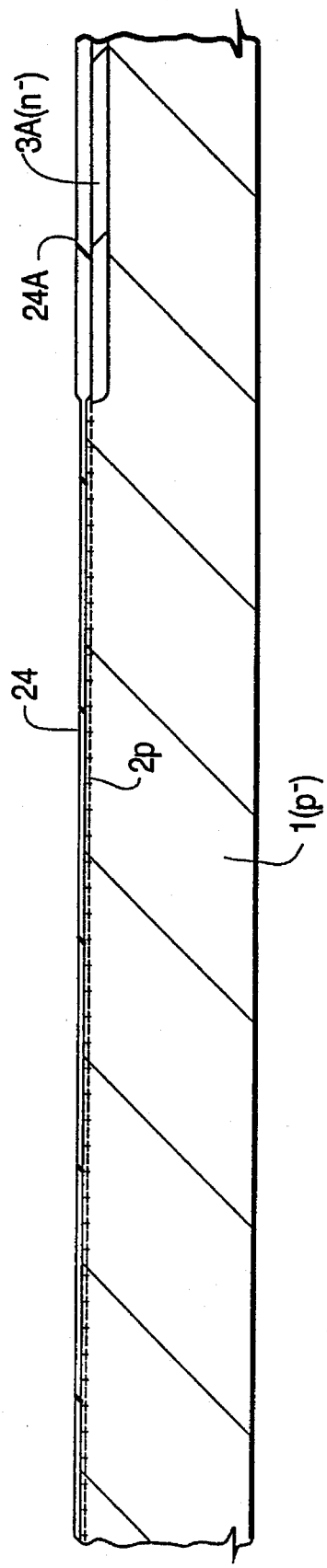

Subsequently, the oxidation-impermeable film 25 is selectively removed. It is removed with, for example, hot phosphoric acid. Thereafter, as illustrated in FIG. 11, a p-type impurity 2p is introduced selectively into the principal surface part of the semiconductor substrate 1 corresponding to a p-type well region-forming region, through the silicon oxide film 24 by employing the silicon oxide film 24A as the impurity introducing mask. The p-type impurity 2p used is, for example, BF$_2$ (or B) at an impurity flux on the order of $10^{12}$–$10^{13}$ atoms/cm$^2$, and is introduced by ion implantation. This p-type impurity 2p is not introduced into the principal surface part of the semiconductor region 3A to become the n-type well region because the silicon oxide film 24A is located thereon.

Figure 12:
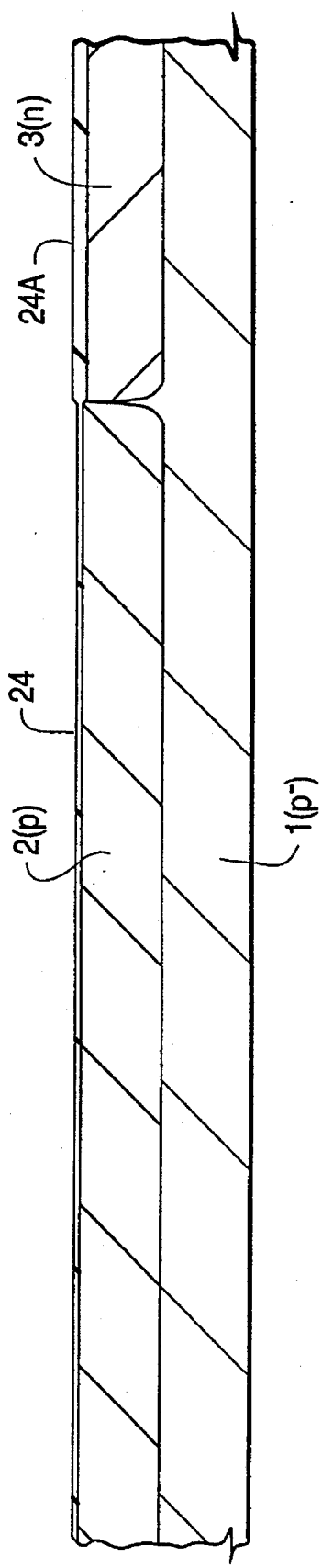

Subsequently, as illustrated in FIG. 12, the n-type impurity 3n and the p-type impurity 2p respectively subjected to drive-in diffusions, to form the n-type well region 3 and the p-type well region 2 as shown in FIG. 12. The well regions 2 and 3 are formed by annealing the substrate in an atmosphere at a high temperature of about 1100°–1300° C. The p-type well region 2 is consequently formed in self-alignment to the n-type well region 3.

Subsequently, an oxidation-impermeable film 26 is formed on the whole surface of the substrate including both the silicon oxide films 24 and 24A. The oxidation-impermeable film 26 is used as an impurity introducing mask and an oxidation-impermeable mask. The oxidation-impermeable film 26 employed is, for example, a silicon nitride film deposited by CVD and is formed to a thickness of about 400–1400 Å.

Subsequently, the oxidation-impermeable film 26 is coated with a photoresist film, and the part of the photoresist film corresponding to a region for forming an element isolating insulator film (5) is removed, to form an etching mask and an impurity introducing mask (not shown). Using the mask, the exposed part of the oxidation-impermeable film 26 is selectively removed.

Subsequently, a p-type impurity 4p is introduced into the principal surface of the well region 2 through the exposed silicon oxide film 24 in such a way that a mask which is made up of the oxidation-impermeable film 26 and the photoresist film having patterned it is employed as the impurity introducing mask. The p-type impurity 4p is not introduced into the principal surface part of the well region 3 because the silicon oxide film 24A which is thicker as compared with the silicon oxide film 24 is formed on the principal surface of the well region 3. That is, the p-type impurity 4p is introduced selectively into the principal surface of the well region 2. It is adapted to form a channel stopper region and a potential barrier layer. It is introduced by ion implantation by employing BF$_2$ or B at an impurity flux on the order of $10^{13}$ atoms/cm$^2$. After the p-type impurity 4p has been introduced, the photoresist film on the oxidation-impermeable film 26 is removed as shown in FIG. 13.

Subsequently, using the oxidation-impermeable film 26 as the oxidation-impermeable mask, the exposed parts of both the silicon oxide films 24 and 24A are grown to form the element isolating insulator film (field insulator film) 5. The element isolating insulator film 5 is formed, for example, in such a way that annealing for about 110–130 min. is carried out in a nitrogen gas atmosphere at a high temperature of about 1000° C., whereupon steam oxidation is carried out for about 150–160 min. Alternatively, it is formed by the use of only a steam oxidation atmosphere. The element isolating insulator film 5 is formed to a thickness of, for example, about 6000–8000 Å.

Figure 27:
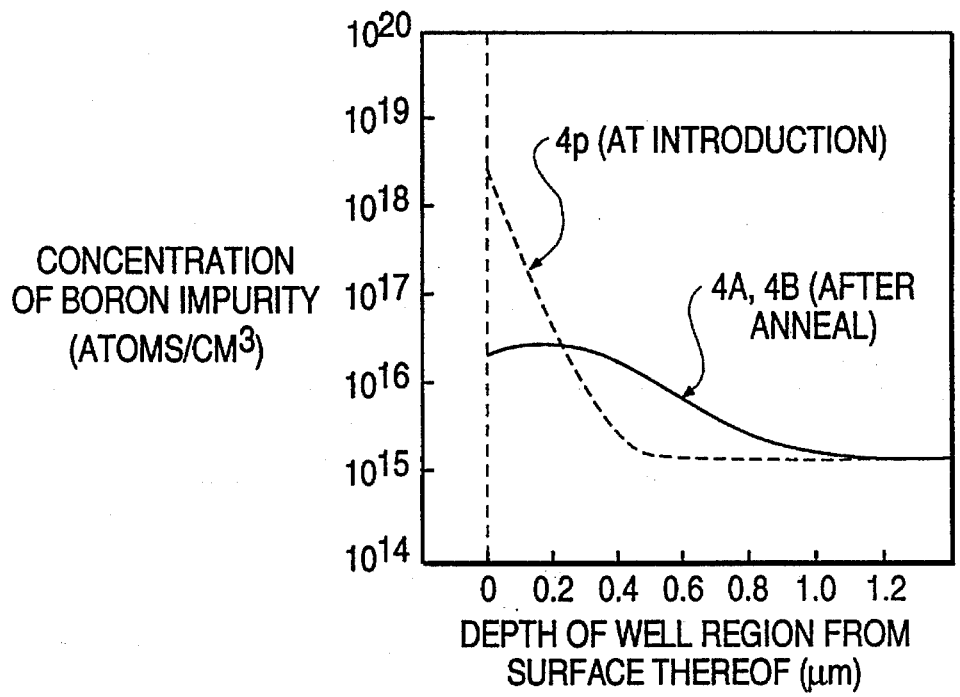
FIG. 27 is a graph showing the impurity concentration distribution in a channel stopper region that provides isolation between elements in the DRAM.

By substantially the same manufacturing step as the step of forming the element isolating insulator film 5, the p-type impurity 4p introduced in the principal surface part of the well region 2 undergoes the drive-in diffusion, and the p-type channel stopper region 4A is formed. In forming this channel stopper region 4A, the annealing which is comparatively long as stated above is carried out, so that the lateral diffusion is extensive as illustrated in FIG. 27 (an impurity concentration profile). Especially in a memory cell array, the p-type impurity 4p is diffused (from locations outside the plane of the cross-section in FIG. 13) into nearly the whole surface of a region for forming memory cells M, and the p-type potential barrier layer 4B is formed.

In FIG. 27, the axis of abscissas represents the depth [μm] of the well region 2 from the surface thereof, and the axis of ordinates the concentration of the p-type impurity (boron) 4p. As seen from FIG. 27, when the distribution of the p-type impurity 4p at the introduction thereof (a dotted line) is compared with the distribution thereof after the execution of the above-stated annealing (a solid line), the impurity diffuses about 0.4–0.6 μm. In a DRAM of large memory capacity, the dimension of the gate width (channel width) of the memory selecting MISFET Q$_s$ of the memory cell M and the dimension of the semiconductor region 9 of the MISFET in the direction of the gate width are about 1.0 μm. Therefore, the p-type impurity 4p forming the channel stopper region 4A diffuses into nearly the whole surface of the memory cell M-forming region, and the potential barrier layer 4B is formed in nearly the whole surface of the memory cell M-forming region as stated before.

In a region for forming an n-channel MISFET $Q_n$ which constitutes the CMOS of a peripheral circuit, the p-type impurity 4p is diffused into only a part of the vicinity of the element isolating insulator film 5, and in effect, the potential barrier layer 4B is not formed, because the size of the MISFET $Q_n$ is larger than that of the memory cell M. That is, the potential barrier layer 4B is not formed in the region for forming the MISFET $Q_n$ of the peripheral circuit, and it is formed selectively in the memory cell array-forming region. Moreover, it can be formed by the same manufacturing step as that of the channel stopper region 4A.

Both the channel stopper region 4A and the potential barrier layer 4B are constructed at an impurity concentration on the order of $10^{16}$–$10^{17}$ atoms/cm$^3$ after the annealing. After the channel stopper region 4A and the potential barrier layer 4B have been formed, the oxidation-impermeable film 26 is selectively removed as illustrated in FIG. 14.

In this manner, in a DRAM wherein each memory cell M is surrounded with an element isolating insulator film 5 and a channel stopper region 4A, a p-type impurity 4p which has the same conductivity type as that of a well region 2 and which is at a concentration higher than that of the well region 2 is introduced into the principal surface part of the well region 2 among the MISFETs $Q_s$ of the memory cells M. Such p-type impurity is also introduced in the principal surface part of the well region 2. The p-type impurity 4p is thereafter diffused to, at least, under a region for forming one semiconductor region (a side to be connected with an information storing capacitor C) 9 of the MISFET $Q_s$, to form the channel stopper region 4A and a potential barrier layer 4B, and to form the element isolating insulator film 5 on the principal surface of the well region 2 among the MISFETs, whereby the step of forming the channel stopper region 4A serves also as the step of forming the potential barrier layer 4B, and hence, the number of the manufacturing steps of the DRAM can be decreased. That is, a mask forming step and an impurity introducing step for forming the potential barrier layer 4B can be dispensed with.

In addition, since the potential barrier layer 4B can be formed in self-alignment to both the element isolating insulator film 5 and the channel stopper region 4A, the dimension of a mask registration allowance in the manufacturing process can be dispensed with. The exclusion of the dimension of the mask registration allowance makes it possible to reduce the area of the memory cell M of the DRAM, and therefore to increase the density of integration.

Besides, since the p-type impurity 4p introduced for forming the channel stopper region 4A is sufficiently diffused in the potential barrier layer 4B by annealing, the damage of the well region 2 attributed to the impurity introduction can be relieved, to decrease crystal defects. The decrease of the crystal defects can enhance the refresh characteristics of the DRAM.

By the way, in a case where the potential barrier layer 4B is formed in the whole surface of a memory cell M-forming region, a memory cell array need not be provided with the well region 2.

After the step of removing the oxidation-impermeable film 26 as illustrated in FIG. 14, the silicon oxide film 24 on the principal surface of the well region 2 and the silicon oxide film 24A on the principal surface of the well region 3 are removed to expose the principal surfaces of the respective well regions 2 and 3.

Subsequently, a silicon oxide film 6A is formed on the exposed principal surfaces of both the well regions 2 and 3. The silicon oxide film 6A is formed for the purpose of oxidizing so-called white ribbons, which is a nitride film of silicon which is formed at the end parts of the element isolating insulator film 5 by the oxidation-impermeable film (silicon nitride film) 26 in forming the element isolating insulator film 5. The silicon oxide film 6A is formed by steam oxidation at a high temperature of about 900°–1000° C. and to a thickness of about 400–1000 Å.

Subsequently, a p-type impurity 27p for adjusting the threshold voltage of each n-channel MISFET is introduced into the principal surface parts of both the well regions 2 (the potential barrier layer 4B in the memory cell array) and 3, namely, the whole surface of the substrate, within an element forming region which is defined by the element isolating insulator film 5. The p-type impurity 27p used is B at an impurity flux on the order of $10^{11}$ atoms/cm$^2$, and is introduced by ion implantation at an energy level of about 30 keV.

Figure 15:
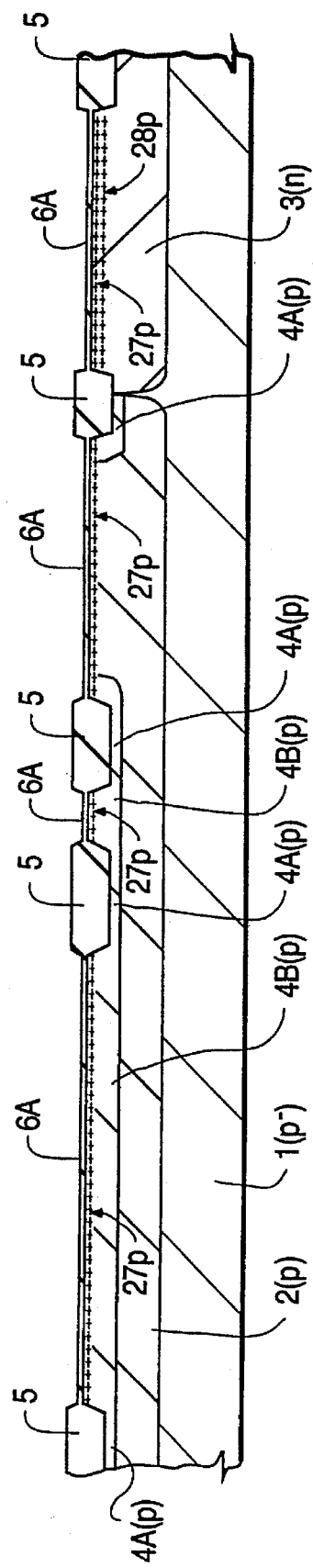

Subsequently, as illustrated in FIG. 15, a p-type impurity 28p for adjusting the threshold voltage of each p-channel MISFET is introduced selectively into the principal surface of the well region 3 within the element forming region which is defined by the element isolating insulator film 5. The p-type impurity 28p used is B at an impurity flux on the order of $10^{12}$ atoms/cm$^2$ and is introduced by ion implantation at an energy level of about 30 keV. These steps of introducing the respective p-type impurities 27p and 28p for adjusting the threshold voltages can be omitted in some ways of setting the impurity concentrations of the respective well regions 2 and 3.

Subsequently, the silicon oxide film 6A is selectively removed to expose the principal surfaces of both the well regions 2 and 3. It is removed by wet etching, conventionally known in the art.

Subsequently, a gate insulator film 6 is formed on the exposed principal surfaces of both the well regions 2 and 3. The gate insulator film 6 is formed by steam oxidation at a high temperature of about 800°–1000° C., and to a thickness of about 150–250 Å.

Subsequently, a polycrystalline silicon film is formed on the whole surface of the substrate including the gate insulator film 6 and the element isolating insulator film 5. The polycrystalline silicon film is deposited by CVD, and is formed to a thickness of about 2000–3000 Å. This polycrystalline silicon film is formed by the step of forming the first layer of gate wiring in the manufacturing process. Thereafter, P is introduced into the polycrystalline silicon film by thermal diffusion so as to lower the resistance of this polycrystalline silicon film.

Subsequently, an inter-layer insulator film 8 is formed on the whole surface of the polycrystalline silicon film. The inter-layer insulator film 8 is chiefly intended to electrically isolate the polycrystalline silicon film and a conductor layer overlying it. The inter-layer insulator film 8 used is, for example, a silicon oxide film deposited by CVD, and it is formed to a thickness of about 3500–4500 Å.

Figure 16:
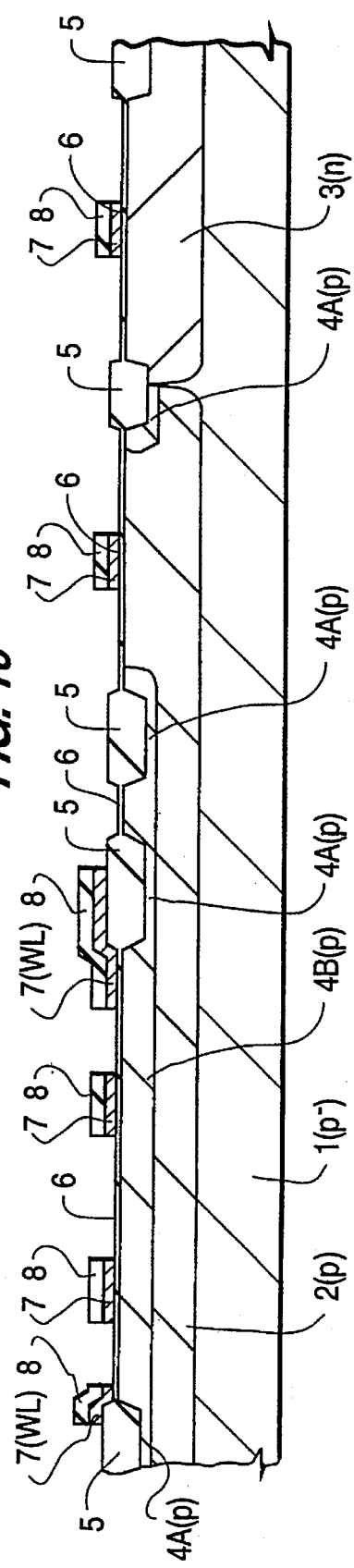

Subsequently, as illustrated in FIG. 16, the inter-layer insulator film 8 and the polycrystalline silicon film are successively etched to form gate electrode films 7 and word lines 7(WL), by employing an etching mask formed of a photoresist film not shown. Since the inter-layer insulator film 8 and the polycrystalline silicon film are stackedly etched, parts of the inter-layer insulator film 8 in the same shapes are left on both gate electrodes 7 and the word lines 7(WL). The step of forming the first layer of gate wiring forms the gate electrodes 7 of the MISFETs $Q_s$ and the word lines 7(WL) in the memory cell array, and also forms the gate electrodes 7 of the MISFETs $Q_n$ and $Q_p$ of the peripheral circuits. Besides, the step of forming the first layer of gate wiring is adapted to form resistors and wiring leads for connecting elements though they are not shown. As the above etching, anisotropic etching such as RIE is employed. Thereafter, the photoresist film is removed.

Subsequently, in order to mitigate contamination ascribable to the impurity introduction, a silicon oxide film (not shown) is formed on the exposed principal surfaces of both the well regions 2 and 3 (including the side walls of the gate electrodes 7 and the word lines 7(WL). by way of example, the silicon oxide film is formed in an oxygen gas atmosphere at a high temperature of about 850°–950° C. and to a thickness of about 100–800 Å.

Subsequently, using the element isolating insulator film 5 and the inter-layer insulator film 8 as an impurity introducing mask, an n-type impurity is introduced selectively into the principal surface parts of the well region 2 corresponding to the memory cell array-forming region and the n-channel MISFET $Q_n$-forming region. By the introduction of the n-type impurity, n-type semiconductor regions 9 of low impurity concentration are formed in self-alignment to the respective gate electrodes 7 and word lines 7(WL). As the n-type impurity for forming the semiconductor regions 9, P (or As) at an impurity flux on the order of $10^{13}$ atoms/cm$^2$ is employed, and it is introduced by ion implantation at an energy level of about 60–120 keV. As described before, at least that semiconductor region 9 of the memory cell-selecting MISFET $Q_s$ of the memory cell M which is connected to the information storing capacitor C is formed by ion implantation at a low impurity flux less than $10^{14}$ atoms/cm$^2$. Since the semiconductor region 9 is formed at the low impurity concentration, each of the MISFETs $Q_s$ and $Q_n$ can be constructed in the LDD structure. In forming the semiconductor regions 9, the p-channel MISFET $Q_p$-forming region is covered with an impurity introducing mask which is formed of a photoresist film. In addition, as will be described later, the MISFET $Q_n$ constituting the CMOS of the peripheral circuit has its source region and drain region constructed of the semiconductor regions 9, and semiconductor regions 17 which are formed by ion implantation at a high impurity flux of or above $10^{14}$ atoms/cm$^2$. The memory cell-selecting MISFETs $Q_s$ of the memory cells M are substantially finished up by the step of forming the semiconductor regions 9.

In this manner, in a DRAM wherein each memory cell M includes an information storing capacitor C of stacked structure, one of the semiconductor regions 9 of the MISFET $Q_s$ of the memory cell M is constructed by ion implantation at an impurity concentration lower than that of the high impurity concentration-semiconductor regions 17 of each of the MISFETs $Q_n$ of peripheral circuits other than the memory cells M. Accordingly, the appearance of crystal defects in the surface of a well region 2 attributed to the ion implantation for forming a source region or a drain region can be mitigated, and the leakage of charges stored in the information storing capacitor C and to serve as information can be lessened, so that the refresh characteristics of the DRAM can be enhanced. The enhancement of the refresh characteristics can increase the speed of the information writing operation and information reading operation of the DRAM.

Besides, since the MISFET $Q_s$ of the memory cell M has the channel forming region side thereof constructed of the semiconductor region 9 of low impurity concentration, the short-channel effect can be suppressed, and the area of the memory cell M can be reduced. That is, the semiconductor region 9 can raise the density of integration of the DRAM.

Moreover, the semiconductor regions 9 of the MISFET $Q_s$ of the memory cell M are formed by the same manufacturing step as that of semiconductor regions 9 for constructing the LDD structure of the MISFET $Q_n$ of the CMOS of the peripheral circuit, whereby the step of the ion implantation of low impurity concentration for the MISFET $Q_s$ is not separately added, but it is simultaneously performed by the step of forming the semiconductor regions 9 of the MISFET $Q_n$, so that the number of the manufacturing steps of the DRAM can be decreased.

Besides, especially in a memory cell M-forming region, a potential barrier layer 4B is formed by the diffusion of the p-type impurity 4p of a channel stopper region 4A, and the impurity concentrations of the two can be set within a low range on the order of $10^{16}$–$10^{17}$ atoms/cm$^3$, so that the breakdown voltage of the p-n junction between the semiconductor region 9 of the MISFET $Q_s$ and the potential barrier layer 4B or channel stopper region 4A can be enhanced. That is, in a DRAM wherein each memory cell M is surrounded with an element isolating insulator film 5 and a channel stopper region 4A, a potential barrier layer 4B formed by diffusing the p-type impurity 4p of the channel stopper region 4A is provided in the principal surface part of a well region 2 under at least one semiconductor region (on a side connected to an information storing capacitor C) 9 of the MISFET $Q_s$ of the memory cell M. The capture of minority carriers into the information storing capacitor C can be avoided by the potential barrier layer 4B, so that the soft errors of a memory cell mode can be prevented. Besides, the impurity concentration of the channel stopper region 4A and that of the potential barrier layer 4B can be made substantially the same impurity concentration, to enhance the breakdown voltage of the p-n junction between the channel stopper region 4A or potential barrier layer 4B and the one semiconductor region 9 mentioned above, so that the leakage of the charges of the information storing capacitor C to serve as information can be lessened to enhance information retention characteristics. The enhancement of the information retention characteristics can enhance the refresh characteristics of the DRAM, and can increase the speed of the information writing operation and information reading operation thereof.

Further, in the DRAM stated above, the potential barrier layer 4B is provided in the principal surface parts of the well region 2 under the one semiconductor region 9 and the other semiconductor region (on a side connected to a complementary data line 21) 9 of the MISFET $Q_s$ of the memory cell M, whereby in addition to the aforementioned effects, the soft errors of a data line mode can be prevented, so that the information retention characteristics can be more enhanced.

Figure 17:
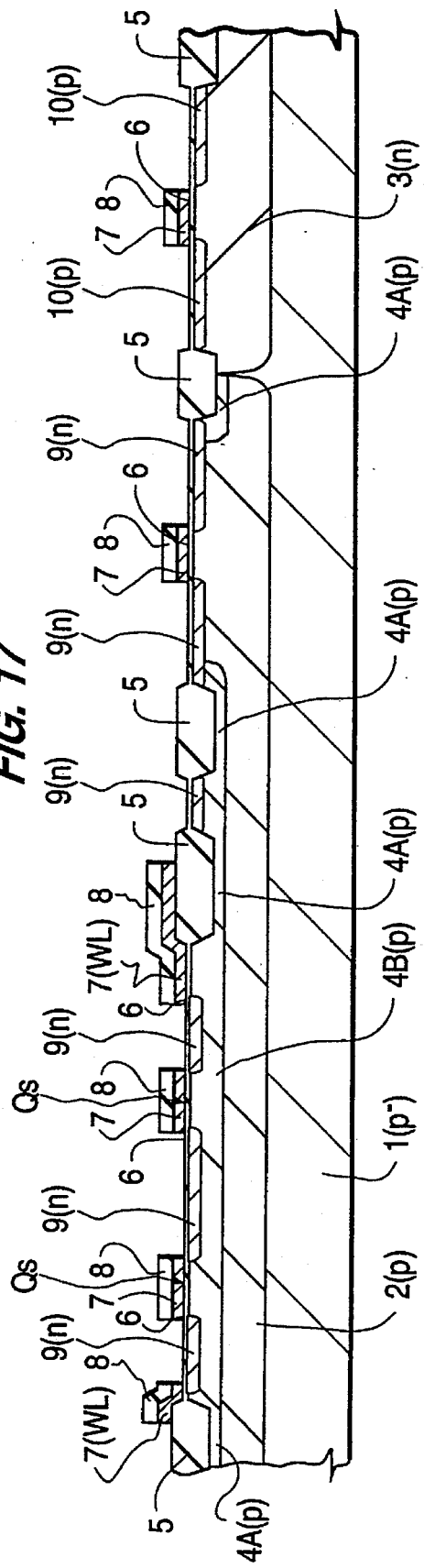

Subsequently, after the step of forming the semiconductor regions 9, using the element isolating insulator film 5 and the inter-layer insulator film 8 as an impurity introducing mask, a p-type impurity is introduced selectively into the principal surface part of the well region 3 corresponding to a p-channel MISFET $Q_p$-forming region. As shown in FIG. 17, p-type semiconductor regions 10 of low impurity concentration self-aligned to the gate electrode 7 are formed by the introduction of the p-type impurity. As the p-type impurity for forming the semiconductor regions 10, $BF_2$ (or B) at an impurity flux on the order of $10^{13}$ atoms/cm$^2$ is employed, and it is introduced by ion implantation at an energy level of about 60–100 keV. In forming the semiconductor regions 10, the memory cell array-forming region and the n-channel MISFET $Q_n$-forming region are covered with impurity introducing masks which are formed of photoresist films.

Subsequently, although not illustrated in the drawings, an n-type impurity is introduced at a high impurity concentration into, at least, a region for forming the drain region of an n-channel MISFET (an electrostatic breakdown preventing circuit) which constitutes the input/output circuit of the DRAM. Owing to the additional introduction of the n-type impurity, this MISFET constituting the input/output circuit can provide for an excess voltage, entering the drain region and giving rise to electrostatic breakdown, to easily leak to the side of the well region 2, and can enhance an electrostatic breakdown voltage.

Figure 18:
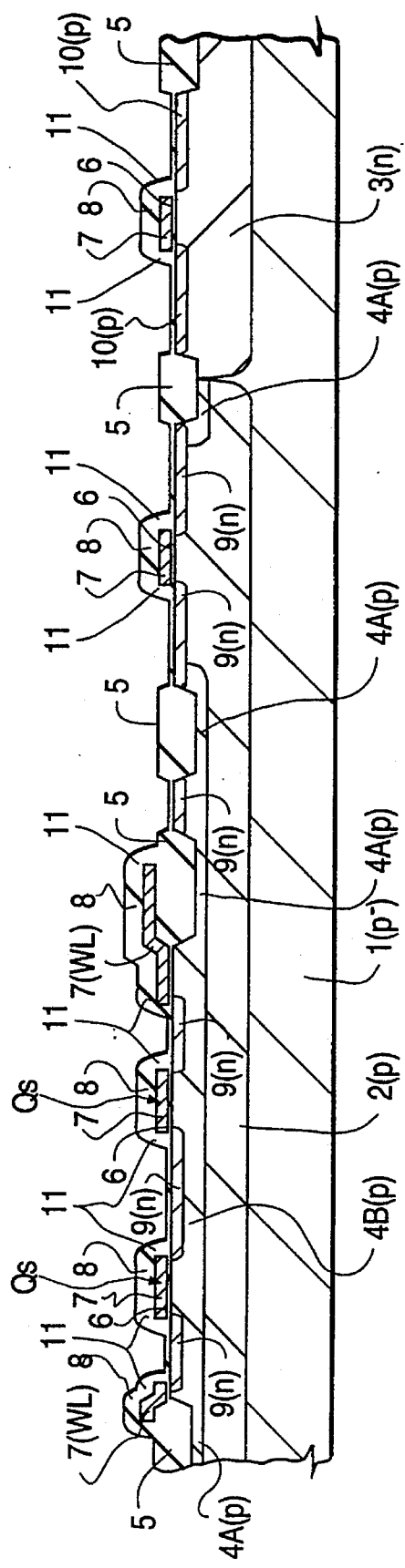

Subsequently, as illustrated in FIG. 18, sidewall spacers 11 are formed on the side walls of each of the gate electrodes 7 and the word lines 7(WL). The side-wall spacers 11 can be formed in such a way that a silicon oxide film deposited by CVD is subjected to anisotropic etching such as RIE. The silicon oxide film is formed at a thickness of, for example, about 3500–4500 Å. The length of the side-wall spacer 11 in the gate length direction (channel length direction) thereof is made about 2500–4000 Å. On this occasion, if necessary, the side-wall spacers may well be formed by etching after their regions have been limited with a photoresist film.

Subsequently, an inter-layer insulator film 12 is formed on the whole surface of the substrate including the inter-layer insulator film 8, the side-wall spacers 11, etc. The inter-layer insulator film 12 is used as an etching stopper in the case of patterning each of a first electrode layer (13) and a second electrode layer (15) which constitute the information storing capacitor C of stacked structure. For this reason, the inter-layer insulator film 12 is formed at a thickness greater than the total thickness of oxide scrape ascribable to over-etching in the operations of etching the first electrode layer and the second electrode layer, the thickness of oxide scrape at washing steps to be carried out before the formation of the second electrode layer, and so on. The inter-layer insulator film 12 is formed so that, especially in patterning the first electrode layer and the second electrode layer, damages attributed to the etching operations may be prevented from arising in the surface of the other semiconductor region (to which the complementary data line 21 is connected) 9 of the memory cell-selecting MISFET $Q_s$. By way of example, the inter-layer insulator film 12 is made of a silicon oxide film deposited by CVD at a high temperature of about 700°–800° C., and it is formed at a thickness of about 1000–2000 Å.

Figure 19:
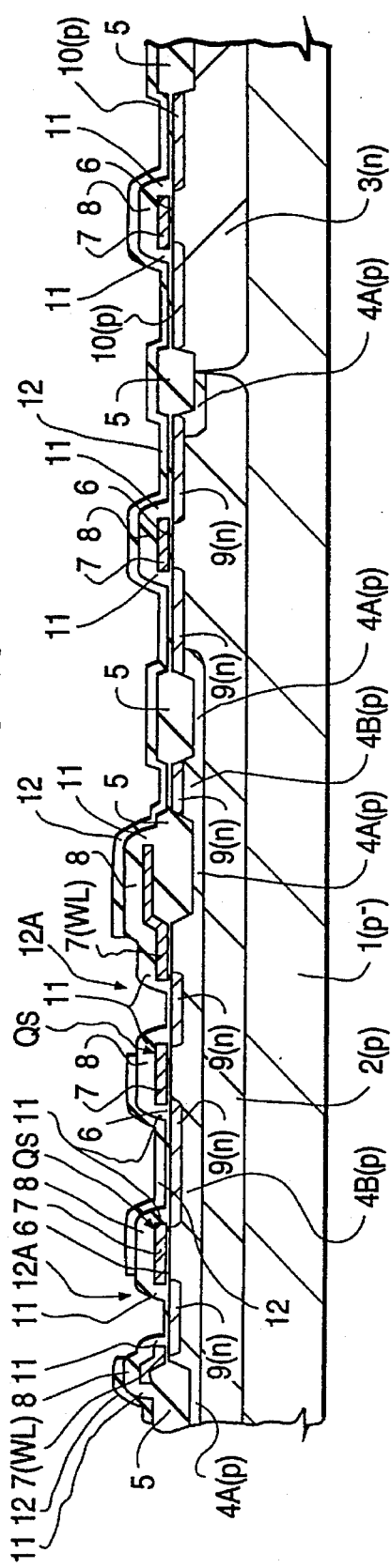

Subsequently, as illustrated in FIG. 19, the part of the inter-layer insulator film 12 on one semiconductor region (to which the first electrode layer 13 of the information storing capacitor C is connected) 9 of each of the MISFETs $Q_s$ in the memory cell M-forming region is selectively removed to form a contact hole 12A. In the direction of columns, the contact hole 12A is formed into a size which is larger, at least, by a component corresponding to the dimension of a mask registration allowance in the manufacturing process, as compared with a size that is defined by the side-wall spacer 11 on the side wall of the gate electrode 7 of the MISFET $Q_s$ and the side-wall spacer 11 on the side wall of the word line 7(WL), adjoining this gate electrode. That is, as regards the contact hole 12A, the substantial size thereof in which the semiconductor region 9 is exposed is defined by the side-wall spacers 11.

Figure 20:
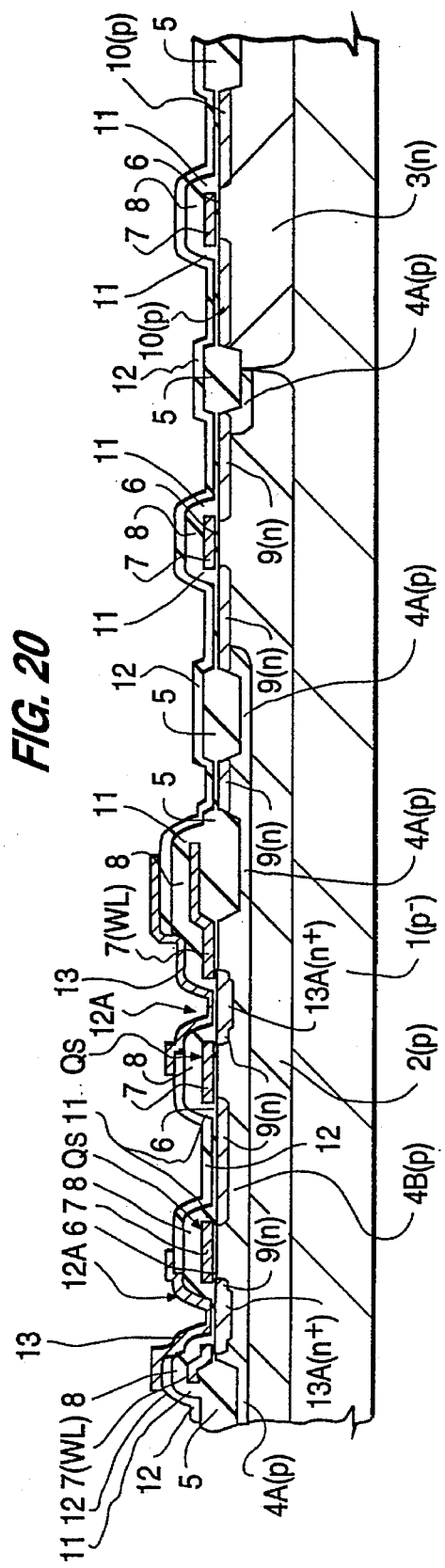

Subsequently, as illustrated in FIG. 20, there are formed the first electrode layers 13 each of which has a part connected to the semiconductor region 9 through the contact hole 12A and has other parts extending on the gate electrode 7 and the word line 7(WL) through the inter-layer insulator films 8 and 12. The first electrode layer 13 constitutes the lower electrode layer of the information storing capacitor C of the stacked structure. This first electrode layer 13 is formed to be larger, at least, by a component corresponding to the dimension of a mask registration allowance in the manufacturing process, as compared with the size of the contact hole 12A formed in the inter-layer insulator film 12. In a case where the size of the first electrode layer 13 is not larger than that of the contact hole 12A by the above value, an end part of the first electrode layer 13 falls into the contact hole 12A, and an unnecessary groove appears between the peripheral wall of the contact hole 12A and the side wall of the end part of the first electrode layer 13. When a photoresist film for patterning the first electrode layer 13 is applied, it is formed to be thicker in the part of the groove than in the other area, and halation occurs in the developing operation of the photoresist film, resulting in an inferior shape of the first electrode layer 13.

The first electrode layer 13 is formed of polycrystalline silicon deposited by CVD, to a thickness of about 800–3000 Å. The polycrystalline silicon film is formed in such a way that a silicon oxide film is first formed on the surface, that an n-type impurity for lowering a resistance is introduced through the silicon oxide film, and that the silicon oxide film is removed after annealing. The silicon oxide film is formed by oxidizing the surface of the polycrystalline silicon film in steam, and to a thickness of about 100 Å. The n-type impurity used is As or P at an impurity flux on the order of $10^{15}$ atoms/cm$^2$, and is introduced by ion implantation at an energy level of about 75–85 keV. The patterning of the polycrystalline silicon film is performed by dry etching. In etching the polycrystalline silicon film, the inter-layer insulator film 12 is used as the etching stopper layer. This first electrode layer 13 is formed by the step of forming the second layer of gate wiring.

The n-type impurity introduced into the first electrode layer (polycrystalline silicon film) 13, by the annealing after the n-type impurity introduction, is diffused into that principal surface part of the well region 2 (actually, the semiconductor region 9) in which the first electrode layer 13 and one semiconductor region 9 are connected. An n$^+$-type semiconductor region 13A of high impurity concentration is formed by the diffusion. The semiconductor region 13A is constructed to be integral with the semiconductor region 9. While the semiconductor region 13A constitutes one semiconductor region of the memory cell-selecting MISFET $Q_s$, it is chiefly intended to enhance the ohmic contact between the semiconductor region 9 and the first electrode layer 13 (lowering the contact resistance).

Incidentally, the first electrode layer 13 inside the contact hole 12A is electrically isolated from each of the gate electrode 7 and the word line 7(WL) through the inter-layer insulator film 8 and the side-wall spacer 11.

The region 13A, while having a higher impurity concentration than region 9, desirably has a lower impurity concentration than the semiconductor regions of MISFETs of the peripheral circuit. For example, MISFETs of the peripheral circuit can have LDD structure. In such case, the region 13A has a lower impurity concentration than the high impurity concentration regions of the LDD structure. Of course, regions 9 have a lower impurity concentration than the high impurity concentration regions of LDD structure of MISFETs of the peripheral circuit.

The region 13A extends to a shallower depth than do regions 9. For example, region 13A extends a depth of approximately 0.1 μm from the surface of well region 2, while region 9 extends to a depth of approximately 0.25 μm from the surface.

Figure 21:
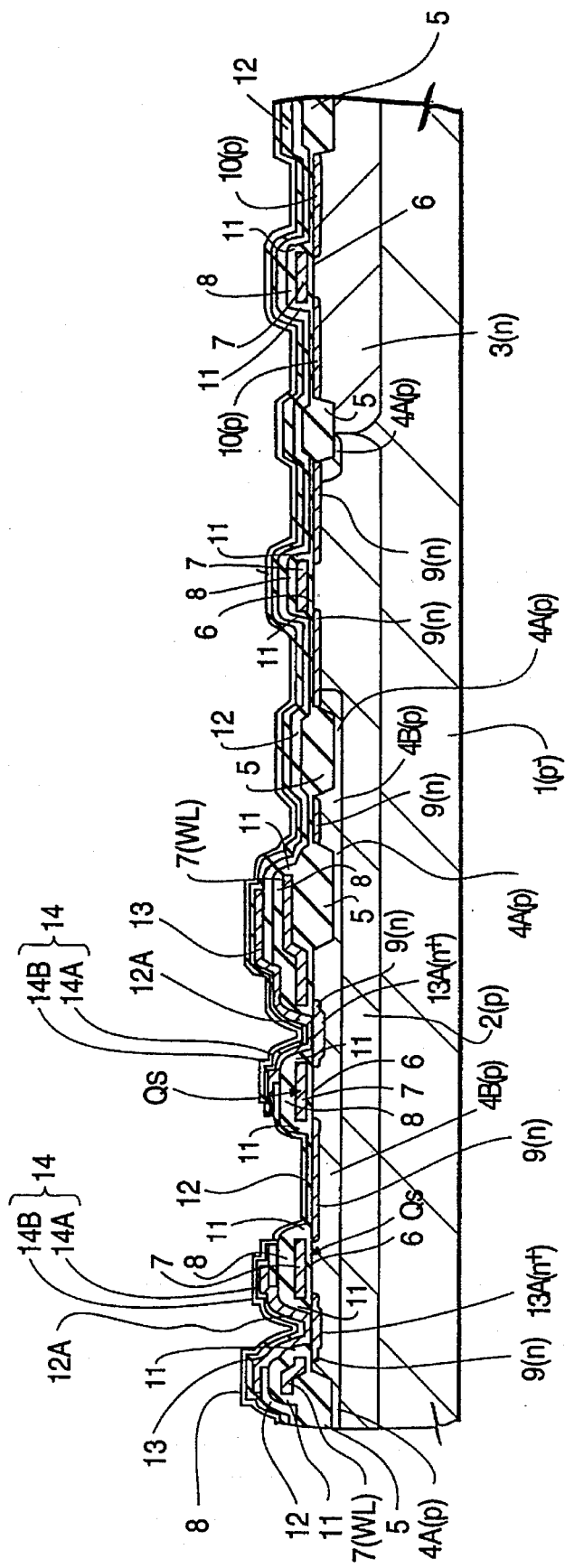

Subsequently, as illustrated in FIG. 21, a dielectric film 14 is formed on the whole surface of the substrate including the first electrode layer 13. As stated before, the dielectric film 14 is basically formed of a double-layer structure in which a silicon nitride film 14A and a silicon oxide film 14B are successively stacked.

The silicon nitride film 14A is deposited on the first electrode layer (polycrystalline silicon film) 13 by CVD, and is formed at a thickness of about 50–110 Å. In forming this silicon nitride film 14A, the involvement of oxygen is suppressed to the utmost. In a case where the silicon nitride film 14A is formed on the polycrystalline silicon film at an ordinary production level, a very slight amount of oxygen is involved, and hence, a natural silicon oxide film (not shown) is formed between the first electrode layer 13 and the silicon nitride film 14A. Accordingly, the dielectric film 14 is constructed of a triple-layer structure in which the natural silicon oxide film, the silicon nitride film 14A and the silicon oxide film 14B are successively stacked.

The natural oxide film lowers the dielectric capacity of the capacitor element, and thus is disadvantageous in connection with the DRAM as described in this embodiment. Accordingly, it is desired either not to form the natural silicon oxide film, or to form such silicon oxide film to be sufficiently thin (for example, 30 Å or less) so as to avoid the above-described disadvantageous effect. One way of avoiding a too-thick natural oxide film is to only raise the semiconductor substrate (e.g., wafer) temperature after sufficient oxygen has been removed from the atmosphere surrounding the substrate so as to avoid a disadvantageously thick natural oxide film. For example, the substrate can have the CVD silicon nitride formed on the semiconductor substrate in a tube furnace, the furnace having a temperature ranging from 300° C., at the entry end, to 1000° C. By moving the substrates from the entry end, to the portion of the furnace having a temperature of 1000° C., only after the atmosphere in the furnace has been changed to remove at least part of the oxygen therein, a sufficiently thin natural oxide film can be achieved.

Alternatively, the dielectric film 14 can be constructed of a double-layer structure by nitrifying the natural silicon oxide film, though this measure adds to the manufacturing step.

Figure 28:
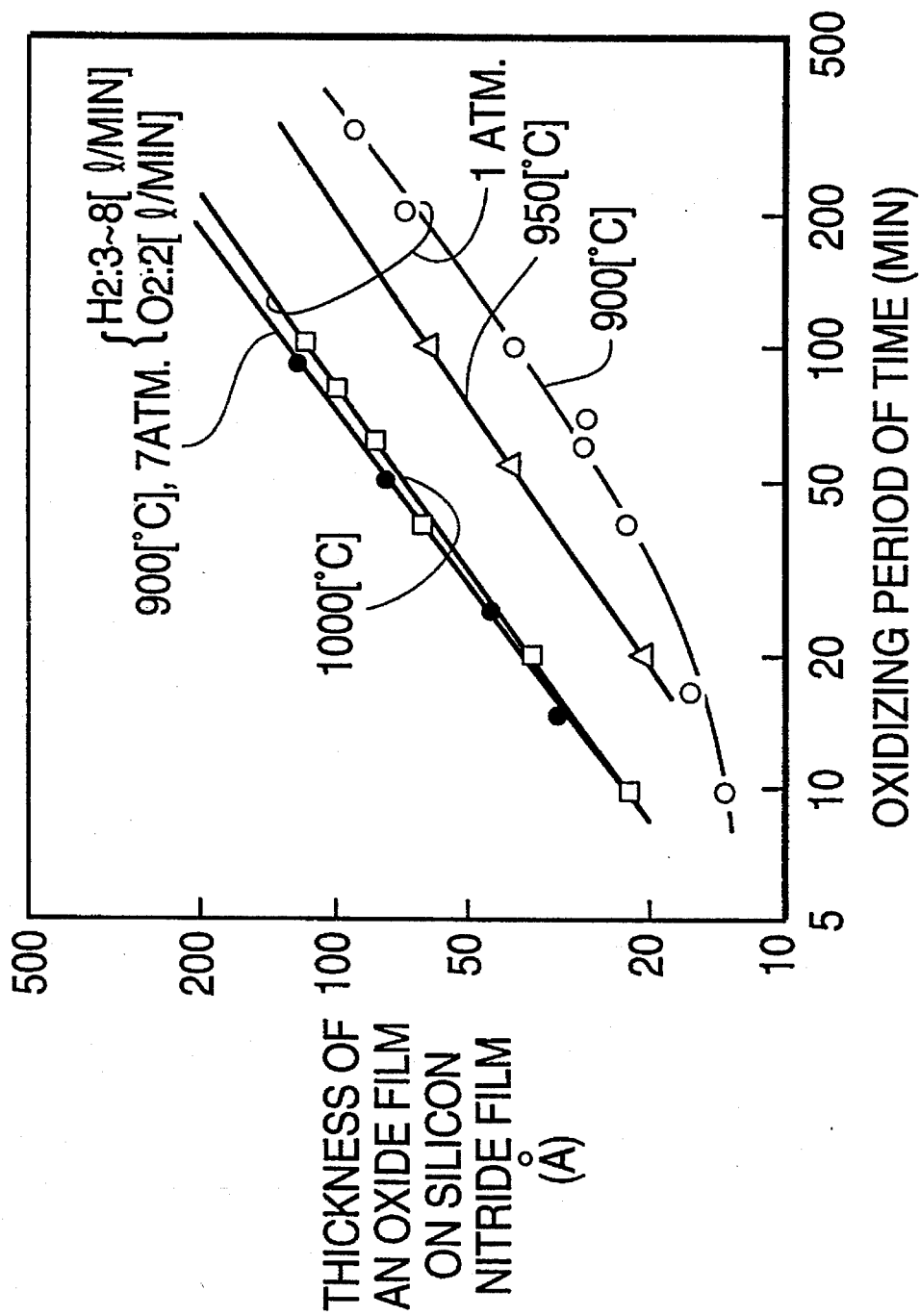
FIG. 28 is a graph showing the oxidation characteristics of a silicon nitride film which defines a dielectric film of each of the information storage capacitor elements in the DRAM.

The silicon oxide film 14B is formed to a thickness of about 10–60 Å by oxidizing the silicon nitride film 14A of the lower layer under a high pressure. When the silicon oxide film 14B is formed, the silicon nitride film 14A is somewhat decreased in thickness, and hence, it is finally formed to a thickness of about 40–80 Å. Basically, the silicon oxide film 14B is formed in an oxygen gas atmosphere having a high pressure of 1.5–10 torr and a high temperature of about 800°–1000° C. In the present embodiment, the silicon oxide film 14B is formed under a high pressure of 3–3.8 torr and by setting the flow rate of oxygen (a source gas) at 2 l./min. and the flow rate of hydrogen (a source gas) at 3–8 l./min. during the oxidation. As illustrated in FIG. 28 (a diagram showing the oxidation characteristics of silicon nitride films), the silicon oxide film 14B which is formed by the high-pressure oxidation can be formed to a desired thickness in a shorter period of time as compared with a silicon oxide film which is formed under the normal pressure (1 torr). In FIG. 28, the oxidizing period of time min. is indicated on the axis of abscissas, and the thickness Å of an oxide film on a silicon nitride film ($Si_3N_4$) is indicated on the axis of ordinates. That is, the high-pressure oxidation shortens the period of time of annealing at a high temperature and can form a dielectric film of good quality. Since the shortening of the oxidizing period of time can decrease the p-n junction depths of the source regions and drain regions of the MISFETs $Q_s$, $Q_n$ and $Q_p$, the microfabrication of the MISFETs can be achieved.

In this manner, in a DRAM having an information storing capacitor C of stacked structure, the first electrode layer 13 of the information storing capacitor C is made of a polycrystalline silicon film in which an impurity for lowering a resistance is introduced, and a dielectric film 14 is configured of a silicon nitride film 14A deposited on the first electrode layer 13 and a silicon oxide film 14B formed on the silicon nitride film 14A by subjecting the surface thereof to high-pressure oxidation. Accordingly, the silicon nitride film 14A of uniform thickness can be formed without being affected by the crystal state and shape of the surface of the underlying first electrode layer 13, and the silicon oxide film 14B of good quality can be formed on this silicon nitride film 14A, so that enhancement in the dielectric strength of the dielectric film 14, decrease in the number of the defects of the dielectric film 14 per unit area and decrease in the leakage current of the dielectric film 14 can be achieved; and a period of time for forming the silicon oxide film 14B can be shortened, so that elements can be microfabricated to increase the density of integration.

Alternatively, the dielectric film 14 of the information storing capacitor C of the stacked structure may well be constructed of a quadruple-layer structure in which the natural silicon oxide film, the silicon nitride film 14A, the silicon oxide film 14B and a silicon nitride film are successively stacked. With the dielectric film 14 of the triple-layer structure described before, current flows more in a case where the electrode layer (15) of the upper side is a negative electrode, than in a case where it is a positive electrode, so that the initial dielectric strength of the dielectric film is low. The dielectric film 14 of the quadruple-layer structure is provided with the silicon nitride film between the silicon oxide film 14B and the electrode layer (15) of the upper layer, and can enhance the initial dielectric strength thereof.

Subsequently, a polycrystalline silicon film for constructing the second electrode layer (15) is formed on the whole surface of the dielectric film 14. The polycrystalline silicon film is deposited by CVD, and is formed at a thickness of about 1500–2500 Å. This polycrystalline silicon film is formed by the step of forming the third level conductive layer, of gate wiring, in the manufacturing process.

Subsequently, an n-type impurity for lowering a resistance is introduced into the polycrystalline silicon film. Phosphorus is used as the n-type impurity, and is introduced into the polycrystalline silicon film by thermal diffusion. The n-type impurity is introduced so that the sheet resistance of the polycrystalline silicon film may become 20–100 Ω.

Subsequently, the whole surface of the polycrystalline silicon film is coated with a photoresist film. Thereafter, the parts of the photoresist film on regions for forming the second electrode layers (15) of the information storing capacitors C of the memory cells M are photolithographically left unetched, to form an etching mask 29 (indicated by dotted lines in FIG. 22).

Figure 22:
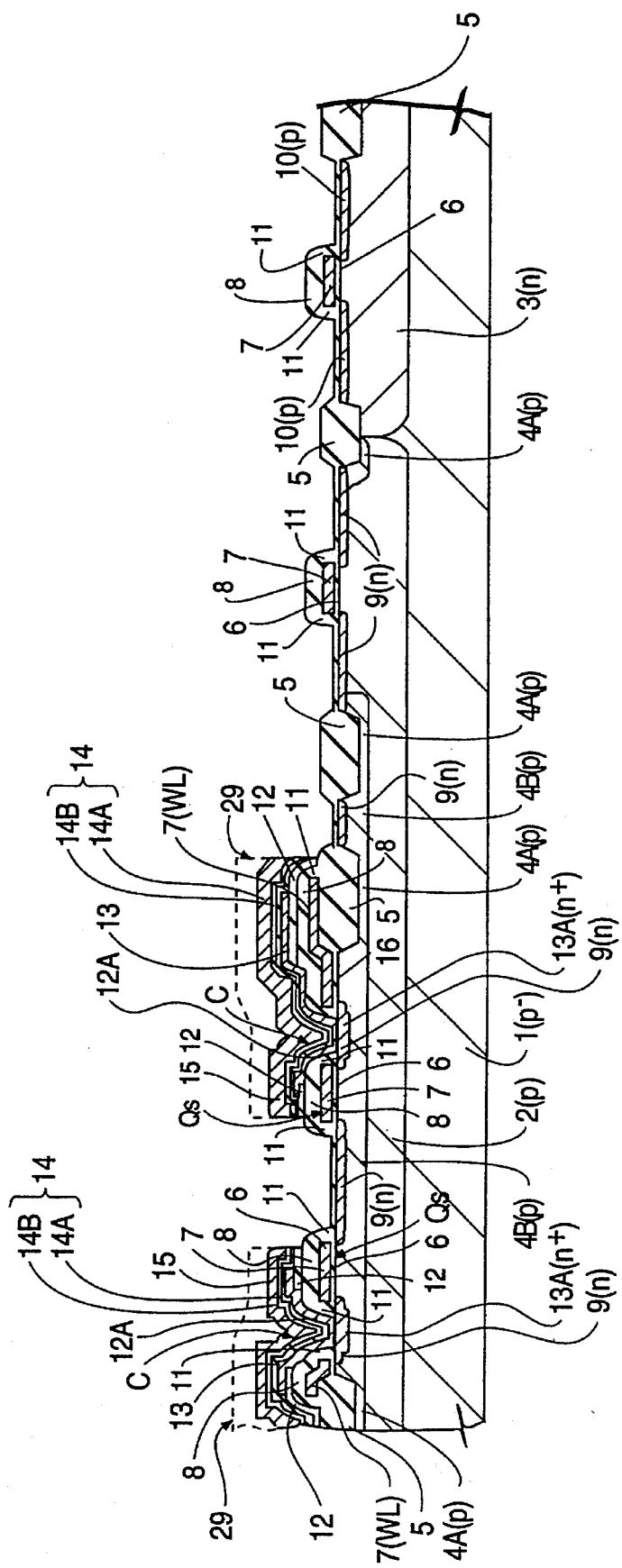

Subsequently, using the etching mask 29, the polycrystalline silicon film is etched to form the second electrode layers 15. As the etching, conventional plasma etching can be used. However, preferably this etching is performed by the known RIE technique. Thereafter, as illustrated in FIG. 22, the exposed parts of the dielectric film 14 and the underlying inter-layer insulator film 12 are successively etched by employing the etching mask 29 (which may well be replaced with the second electrode layers 15) again. As this etching, conventional dry etching can be used. However, preferably this etching is also performed by the known RIE technique. The dielectric film 14 is formed substantially in the same shape as that of the second electrode layer 15 so as to exist only under this electrode layer. The parts of the dielectric film 14 and the inter-layer insulator film 12 on the other regions (to which the complementary data lines 21 are connected) 9 of the MISFETs $Q_s$ of the memory cells M and on the regions for forming both the MISFETs $Q_n$ and $Q_p$ of the peripheral circuits, are removed by the etching.

By the step of forming the second electrode layers 15, the information storing capacitors C of the stacked structure constituting the memory cells M are nearly finished up. Simultaneously, the memory cells M are nearly finished up.

In this manner, in a DRAM wherein each memory cell M includes an information storing capacitor C of stacked structure, the information storing capacitor C of the stacked structure is configured of a first electrode layer 13 which is connected to one semiconductor region 9 of a MISFET $Q_s$, a second electrode layer 15 which is provided over the first electrode layer 13 so as to cover it, and a dielectric film 14 which is interposed between the first electrode layer 13 and the second electrode layer 15 and which has substantially the same shape as that of the second electrode layer 15. Accordingly, the dielectric film 14 is covered with the second electrode layer 15, and the accumulation of charges in the dielectric film 14 (the charge-up of the dielectric film 14) at the step of patterning the second electrode layer 15 or at a later step can be relieved, so that the degradation of the dielectric strength (characteristics) of the dielectric film 14 attributed to the accumulation of the charges can be prevented. The prevention of the degradation of the dielectric strength of the dielectric film 14 can enhance the electrical reliability of the DRAM.

Besides, in a DRAM wherein each memory cell M includes an information storing capacitor C of stacked structure, (1) a MISFET $Q_s$ for selecting the memory cell is formed, (2) an inter-layer insulator film 12 which covers the MISFET $Q_s$ is formed, (3) the part of the inter-layer insulator film 12 on one semiconductor region 9 of the MISFET $Q_s$ is selectively removed to form a contact hole 12A through which the aforementioned semiconductor region 9 is exposed, that first electrode layer 13 of the information storing capacitor C of the stacked structure which is connected to the aforementioned semiconductor region 9 through the contact hole 12 and which is extended over the gate electrode 7 of the MISFET $Q_s$ through the insulator film 12 is formed, (4) a dielectric film 14 is formed on the first electrode layer 13, (5) a second electrode layer 15 which overlies the first electrode layer 13 through the dielectric film 14 is formed, and (6) using the second electrode layer 15 or a mask 29 for patterning it as a mask, at least the part of the-inter-layer insulator film 12 on the other semiconductor region 9 of the MISFET $Q_s$ is removed, whereby the second electrode layer 15 or the mask 29 can be used also as a mask for removing the part of the inter-layer insulator film 12 on the other semiconductor region 9 on a side which is connected with the complementary data line (21) of the MISFET, so that the step of forming the mask for removing the inter-layer insulator film 12 can be omitted.

Moreover, the part of the inter-layer insulator film 12 on the other semiconductor region 9 of the MISFET $Q_s$ can be removed in self-alignment to the second electrode layer 15 because of the use of the same mask, so that the area of the memory cell M can be reduced in correspondence with the dimension of a mask registration allowance in a manufacturing process. As a result, the density of integration of the DRAM can be heightened.

Subsequently, an insulator film 16 is formed on the whole surface of the substrate. The insulator film 16 is formed on the semiconductor regions 9 and 10 being source and drain regions, at least within the region for forming the CMOS of the peripheral circuits. By way of example, the insulator film 16 is formed of a silicon oxide film deposited by CVD and to a thickness of about 300 Å.

Subsequently, an n-type impurity is introduced selectively into the principal surface of the well region 2 within each region for forming the n-channel MISFET $Q_n$ which constitutes the CMOS of the peripheral circuit. The introduction of the n-type impurity is carried out by mainly employing the gate electrode 7 and the inter-layer insulator film 8 as an impurity introducing mask, in the state in which the memory cell M-forming region and the p-channel MISFET $Q_p$-forming region are covered with a photoresist film. The n-type impurity used is, for example, As at an impurity flux on the order of $10^{15}$ atoms/cm$^2$, and is introduced by ion implantation at an energy level of about 70–90 keV.

Subsequently, a p-type impurity is introduced selectively into the principal surface part of the well region 3 within each region for forming the p-channel MISFET $Q_p$ which constitutes the CMOS of the peripheral circuit. The introduction of the p-type impurity is carried out by mainly employing the gate electrode 7 and the inter-layer insulator film 8 as an impurity introducing mask, in the state in which the memory cell M-forming region and the n-channel MISFET $Q_n$-forming region are covered with a photoresist film. The p-type impurity used is, for example, $BF_2$ at an impurity flux on the order of $10^{15}$ atoms/cm$^2$ and is introduced by ion implantation at an energy level of about 70–90 keV.

Figure 23:
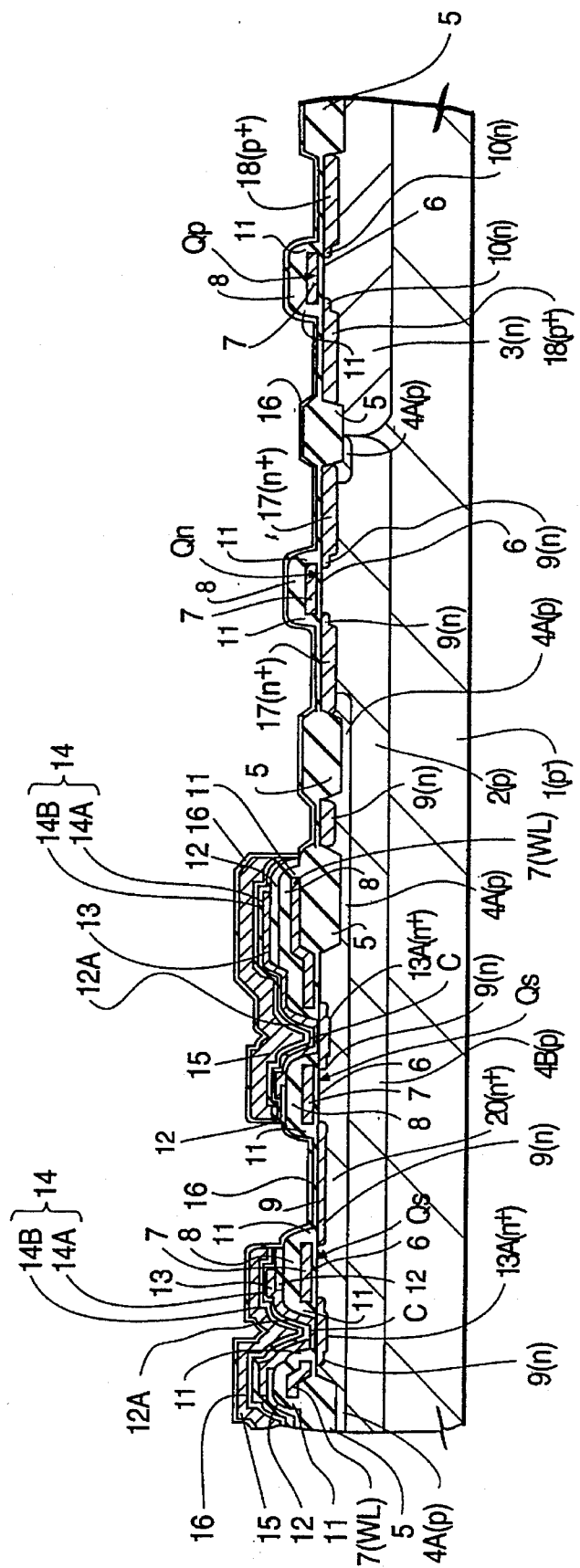

Thereafter, the n-type impurity and the p-type impurity are subjected to drive-in diffusions to form n$^+$-type semiconductor regions 17 in the principal surface parts of the well region 2 and p$^+$-type semiconductor regions 18 in the principal surface parts of the well region 3 as shown in FIG. 23. The drive-in diffusions are carried out at a high temperature of about 900°–1000° C. for about 10 min. The MISFET $Q_n$ is nearly finished up by the step of forming the semiconductor regions 17, while the MISFET $Q_p$ is nearly finished up by the step of forming the semiconductor regions 18.

Subsequently, an inter-layer insulator film 19 is formed on the whole surface of the substrate. The inter-layer insulator film 19 is constructed of a double-layer structure in which a silicon oxide film 19A deposited by CVD, and a silicon oxide film (such as BPSG) 19B deposited by CVD and capable of glass flow, are stacked in succession.

The silicon oxide film 19A of the lower layer is formed in order to prevent B and P, contained in the silicon oxide film 19B, from leaking to the underlying element, and to ensure the dielectric strength of each part of the silicon oxide film 19B thinned by the glass flow. The silicon oxide film 19A is formed at a thickness of, for example, about 500–2000 Å.

The silicon oxide film 19B of the upper layer is formed in order to flatten the surface thereof for the purpose of enhancing the step coverage of overlying wiring (21). The silicon oxide film 19B is formed at a thickness of, for example, about 3000–7000 Å.

Subsequently, the silicon oxide film 19B being the upper layer of the inter-layer insulator film 19 is subjected to the glass flow so as to flatten the surface thereof. By way of example, the glass flow is carried out in a nitrogen gas atmosphere at a high temperature of about 900°–1000° C.

Subsequently, the part of the inter-layer insulator film 19 on each of the semiconductor regions 9, 17 and 18, the part thereof on the word line 7(WL) (not shown) and the part thereof on the second electrode layer 15 (not shown) are selectively removed to form contact holes 19C. The contact holes 19C are formed by subjecting the upper part of the inter-layer insulator film 19 to wet etching, and the lower part thereof to anisotropic etching such as RIE. The contact hole 19C is in a tapered shape in which the opening size of the upper side of the inter-layer insulator film 19C is large, and the opening size of the lower side thereof is small, so that the breaking of the overlying wiring (21) can be prevented. Alternatively, the contact holes 19C may well be formed by only the anisotropic etching.

Subsequently, a silicon oxide film 30 is formed on those parts of the silicon surfaces of the semiconductor regions 9, etc. which are exposed through the contact holes 19C. The silicon oxide film 30 is formed in order to prevent the B or P of the silicon oxide film 19B of the inter-layer insulator film 19 from being introduced into the principal surface parts of the semiconductor regions 9, etc. through the contact holes 19C by annealing at a later step (the drive-in diffusion of an impurity for forming semiconductor regions 20). In a case where B has been introduced into the semiconductor regions 9 or 17 of the n-type or where P has been introduced into the semiconductor regions 18 of the p-type, the effective impurity concentration of the semiconductor regions lowers, and the contact resistance between each semiconductor region and wiring connected thereto increases. The silicon oxide film 30 is formed into a thin film whose thickness is about 120–300 Å.

Figure 24:
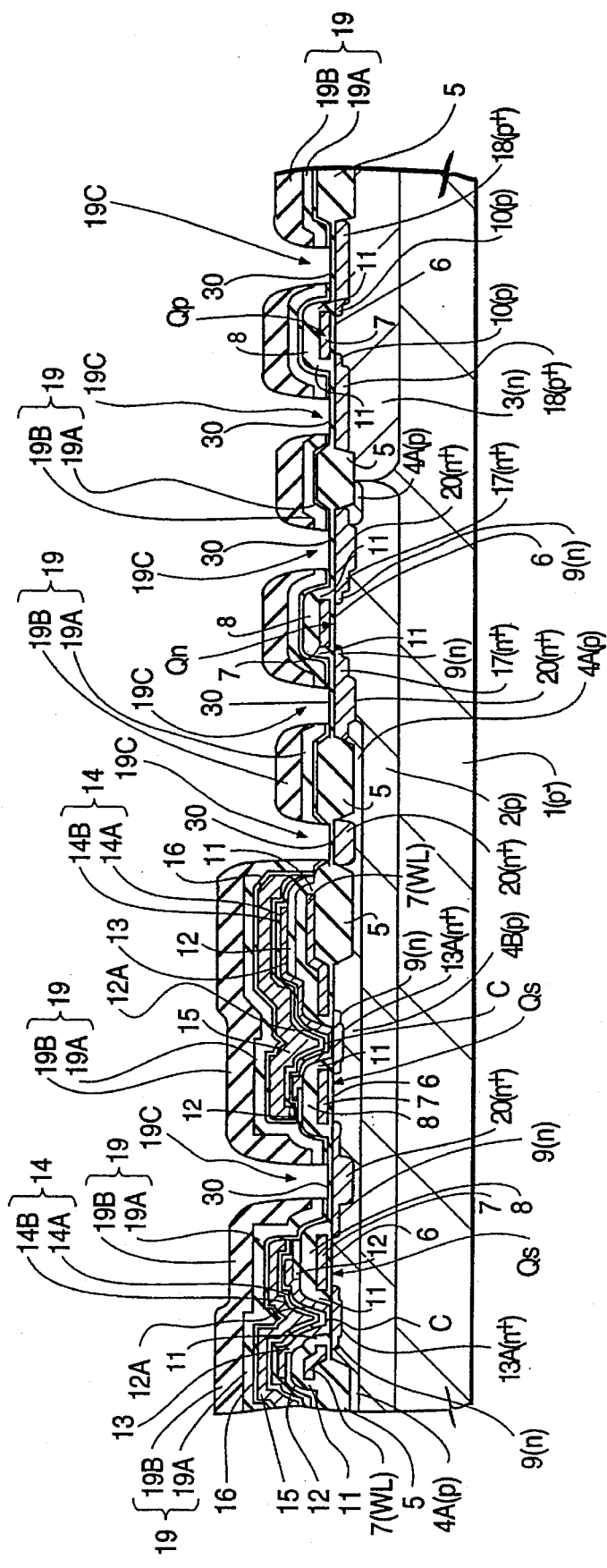

Subsequently, in the regions for forming the memory cell-selecting MISFET $Q_s$ and the n-channel MISFET $Q_n$, the n-type impurity is introduced selectively into the principal surface parts of the semiconductor regions 9 and 17 through the contact holes 19C. The n-type impurity is passed through the silicon oxide film 30. This n-type impurity is subsequently subjected to the drive-in diffusion, to form the $n^+$-type semiconductor regions 20 of high impurity concentration as shown in FIG. 24. The semiconductor region 20 is formed in order to prevent the situation that, in a case where the semiconductor region 9 or 17 and the contact hole 19C have not coincided due to a mask misregistration in the manufacturing process, the well region 2 and the wiring (21) to be passed through the contact hole 19C short-circuit. By way of example, the n-type impurity used for forming the semiconductor region 20 is As at a high impurity flux on the order of $10^{15}$ atoms/cm$^2$, and it is introduced by ion implantation at an energy level of about 110–130 keV. In the memory cell M, the semiconductor region 20 is made integral with the other semiconductor region 9 of the MISFET $Q_s$, and it constructs a part of the source region or drain region. Since the semiconductor region 20 is formed by the ion implantation at the high impurity concentration, the contact resistance thereof with the complementary data line (21) can be lowered.

Figure 25:
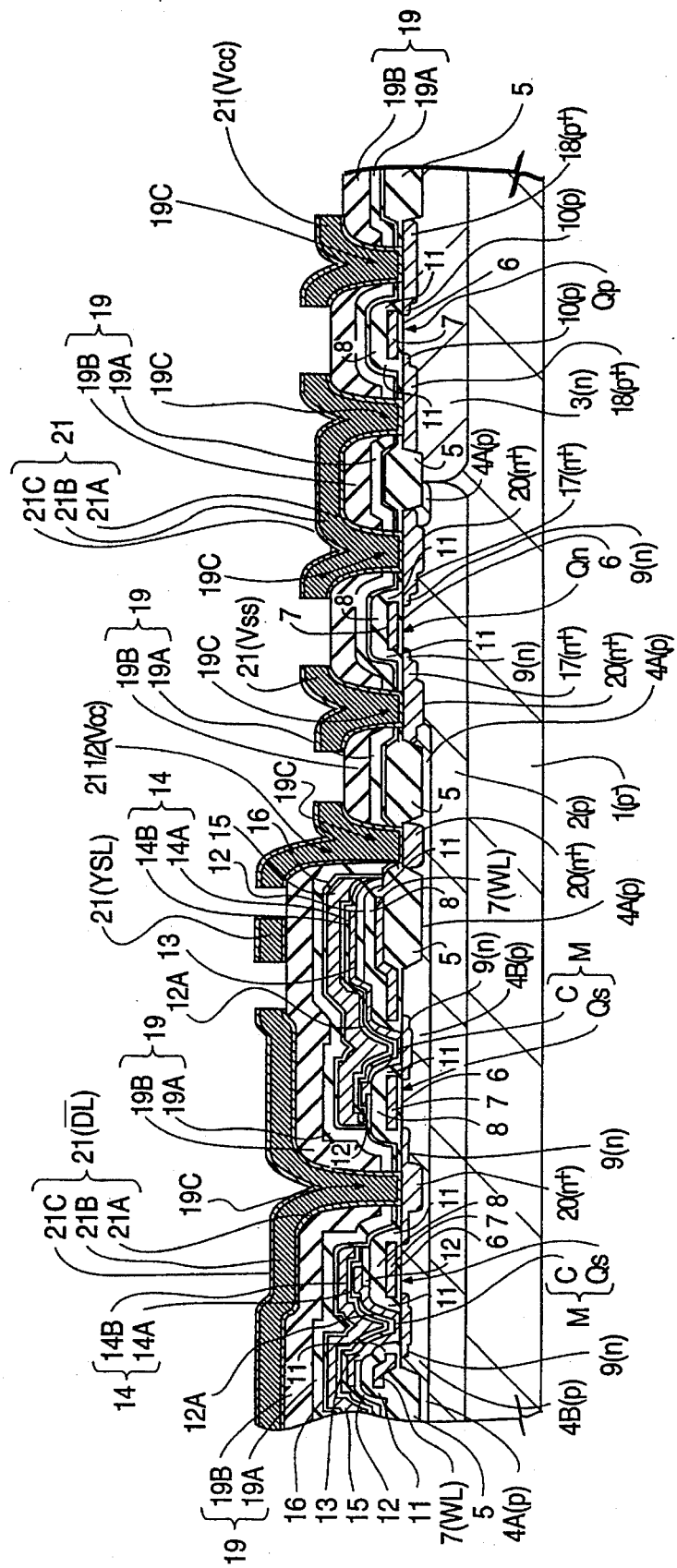

Subsequently, as illustrated in FIG. 25, there are formed the wiring leads 21 which are respectively connected with the semiconductor regions 9, 17, 18 etc. through the contact holes 19C and which extend on the inter-layer insulator film 19. The wiring leads 21 are formed by the step of forming the first layer of wiring, and they construct the complementary data lines 21, the Y-select signal lines 21, etc. as described before. The wiring 21 is constructed of a triple-layer structure in which a barrier metal film 21A, an aluminum film 21B and a protective film 21C are successively stacked. This wiring 21 is patterned by the use of anisotropic etching such as RIE.

The barrier metal film 21A is made of MoSi$_2$ deposited by sputtering, and is formed to a thickness of about 100–200 Å. Since the barrier metal film 21A is formed under the whole lower surface of the aluminum film 21B and can introduce Mo into the aluminum film 21B, it can suppress the growth of the crystal grains of aluminum and mitigate stress migration.

The aluminum film 21B is doped with additives Cu and Si. It is deposited by sputtering, and is formed to a thickness of about 4000–6000 Å.

The protective film 21C is made of MoSi$_x$ ($x = 0 < x < 1.2$), and is formed to a thickness of about 100–1000 Å. As described before, this protective film 21C is formed in order to protect the surface of the aluminum film 21B from a liquid which is used in the wet process for forming the wiring 21.

Figure 29:
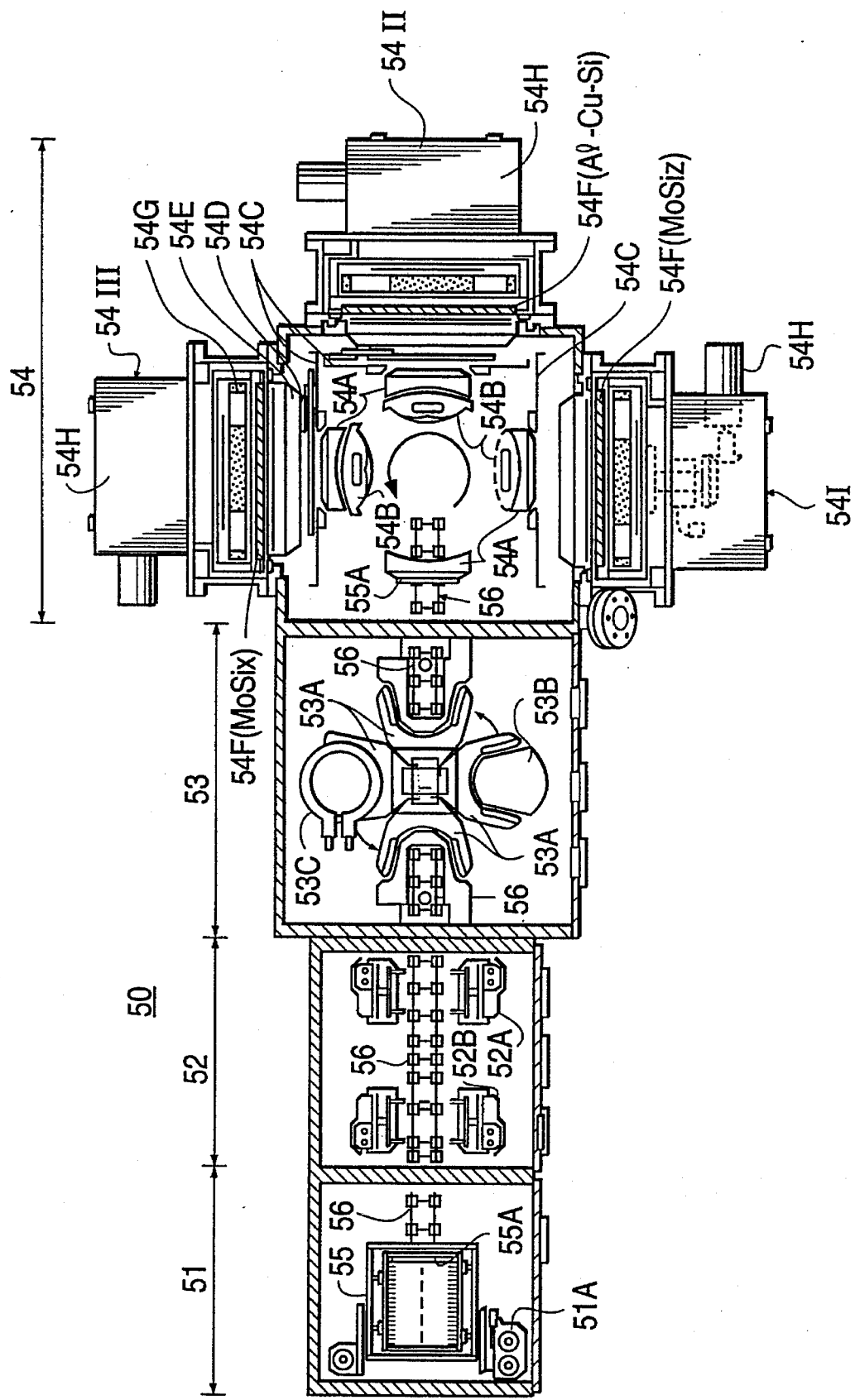
FIG. 29 schematically shows the arrangement of sputtering equipment for forming interconnections used in the DRAM.

The respective layers of the wiring 21 are formed by a sputtering apparatus 50 shown in FIG. 29 (a schematic constructional view of a sputtering apparatus). As depicted in FIG. 29, the sputtering apparatus 50 is mainly configured of a single-loader chamber 51, a twin-loader chamber 52, a cleaning chamber 53 and a sputtering chamber 54.

The single-loader chamber 51 is so constructed that a plurality of wafers 55A accommodated in a cassette 55 are successively supplied into the cleaning chamber 53 and the sputtering chamber 54 through wafer conveyance belts 56. The cassette 55 is so constructed that the plurality of wafers 55A can be held in erect states. The cassette 55 is transported to a feed position for the wafer 55A by an elevator unit 51A. At this position, the cassette is erect so that the plane of the wafer 55A and the conveyance direction thereof may coincide to permit the smooth feed of the wafer 55A. When continuous processing is performed, the single-loader chamber 51 is used conjointly with the twin-loader chamber 52.

The twin-loader chamber 52 is so constructed that "wafers 55A can be supplied into the cleaning chamber 53 and the sputtering chamber 54, and that processed wafers 55A can be received therein. Although not shown, a cassette 55 in which the wafers 55A to be supplied are accommodated is constructed so as to be transported by an elevator unit 52A. A cassette 55 in which the processed wafers 55A are accommodated is constructed so as to be transported by an elevator unit 52B.

The cleaning chamber 53 is so constructed that the wafer 55A conveyed from the twin-loader chamber 52 by the wafer conveyance belt 56 is held and rotated in the direction of arrows by a quartz arm 53A. The quartz arms 53A are arranged in a number of four at equal intervals of 90 degrees, and the four quartz arms 53A are constructed so as to rotate about an identical axis of rotation. The wafer 55A held by the quartz arm 53A confronts a sputter-etching electrode 53B and has its surface cleaned, or it is heated by a pre-processing heater 53C (to a temperature of about 250° C., for example). In addition, the quartz arm 53A is constructed so as to hold the processed wafer 55A conveyed from the sputtering chamber 54 by the wafer conveyance belt 56, and to transport it into the twin-loader chamber 52.

The sputtering chamber 54 is provided with a wafer holder 54A which can hold the wafer 55A in the erect state. Likewise to the quartz arms 53A, the wafer holders 54A are arranged in a number of four at equal intervals of 90 degrees, and the four wafer holders 54A are constructed so as to rotate about an identical axis of rotation. Sputtering portions 54I, 54II and 54 III are respectively disposed at positions which confront the surfaces (planes for holding the wafers 55A) of the three wafer holders 54A other than the wafer holder 54A located at the wafer conveyance belt 56. A heater 54B is arranged on the rear side of each of the three wafer holders 54A.

Each of the sputtering portions 54I, 54II and 54III is provided with a shield plate 54C, a shutter 54D, a target 54E, a target 54F, a magnet 54G and a target rotating unit 54H in this order as viewed from the side of the wafer holder 54A. The target 54 of the sputtering portion 54I is made of $MoSi_2$. The target 54 of the sputtering portion 54II is made, of Al—Cu—Si. The target 54F of the sputtering portion 54III is made of $MoSi_x$. Thus, the sputtering chamber 54 can successively and continuously stack the barrier metal film 21A, aluminum film 21B and protective film 21C on the wafer 55A, namely, on the inter-layer insulator film 19 of the DRAM within a single vacuum system (a single chamber).

As seen in the foregoing, the apparatus of FIG. 29 can be used to deposit layers stacked one on the other, the layers being formed by sputter deposition, without breaking the vacuum in the apparatus. As an exemplary technique for forming stacked layers (such described technique not being limiting), first the pressure within the sputtering chamber is decreased to, at most, $1 \times 10^{-6}$ Torr (that is, the pressure can be decreased to a value less than $1 \times 10^{-6}$ Torr); thereafter, argon gas is introduced into the chamber so as to increase pressure to about $1 \times 10^{-3}$ Torr. The layers (e.g., wiring layers and sub-layers) are formed by sputtering without breaking the vacuum, that is, with the pressure remaining at about $1 \times 10^{-3}$ Torr.

In a DRAM wherein the protective film 21C (the metal wiring of the upper layer) is stacked directly on the aluminum film 21B (the metal wiring of the lower layer) of the wiring 21, the aluminum film 21B is formed by sputtering within the vacuum system, and thereafter, the protective film 21C is continuously formed on the aluminum film 21B by sputtering within the same vacuum system, the production of an aluminum oxide on the surface of the aluminum film 21B can be, mitigated. Accordingly, the specific resistance of the wiring 21 which is formed of the aluminum film 21B and the protective film 21C can be lowered. The lowering of the specific resistance of the wiring 21 can raise the operating speed of the DRAM.

In addition, with the wiring 21 which is mainly made of the aluminum film 21B doped with an element (such as Cu) for reducing migration, the aluminum film 21B doped with the element is formed, and this aluminum film 21B is overlaid with the protective film 21C for protecting it from a liquid which is used in a wet process; an etching mask (which is not shown and which is an etching mask for the wiring 21) is formed on this protective film 21C, the protective film 21C and the aluminum film 21B are etched into a predetermined shape by the use of this etching mask, and the wet process for removing the etching mask is thereafter performed, whereby a galvanic reaction of a cell which is constructed of the aluminum film 21B and an intermetallic compound formed by the aluminum and the element of this film can be prevented during the etching or wet process, so that the damage of the aluminum film 21 attributed to the galvanic reaction can be prevented. As a result, the wiring 21 can have any interior shapes decreased, can have breaking prevented, and the migration reduced.

After the step of forming the wiring 21 illustrated in FIG. 25, an inter-layer insulator film 22 is formed on the whole surface of the substrate including the wiring 21. As stated before, the inter-layer insulator film 22 is constructed of a triple-layer structure.

A silicon oxide film 22A as the lower layer is formed at a thickness of about 1000–2000 Å.

A silicon oxide film 22B as the middle layer is formed in order to flatten the surface thereof. The silicon oxide film 22B is formed by several times (2–5 times) of coating (coating to a total thickness of about 1000–2000 Å, for example, by a spin-on technique) and a baking treatment (at about 450° C.), into a densified film. Alternatively, the silicon oxide film 22B may well be formed by gradually heightening the temperature of a baking treatment, into a film of good quality.

A silicon oxide film 22C as the upper layer is formed in order to raise the strength of the whole inter-layer insulator film 22. The silicon oxide film 22C is formed at a thickness of about 4000–7000 Å.

Figure 26:
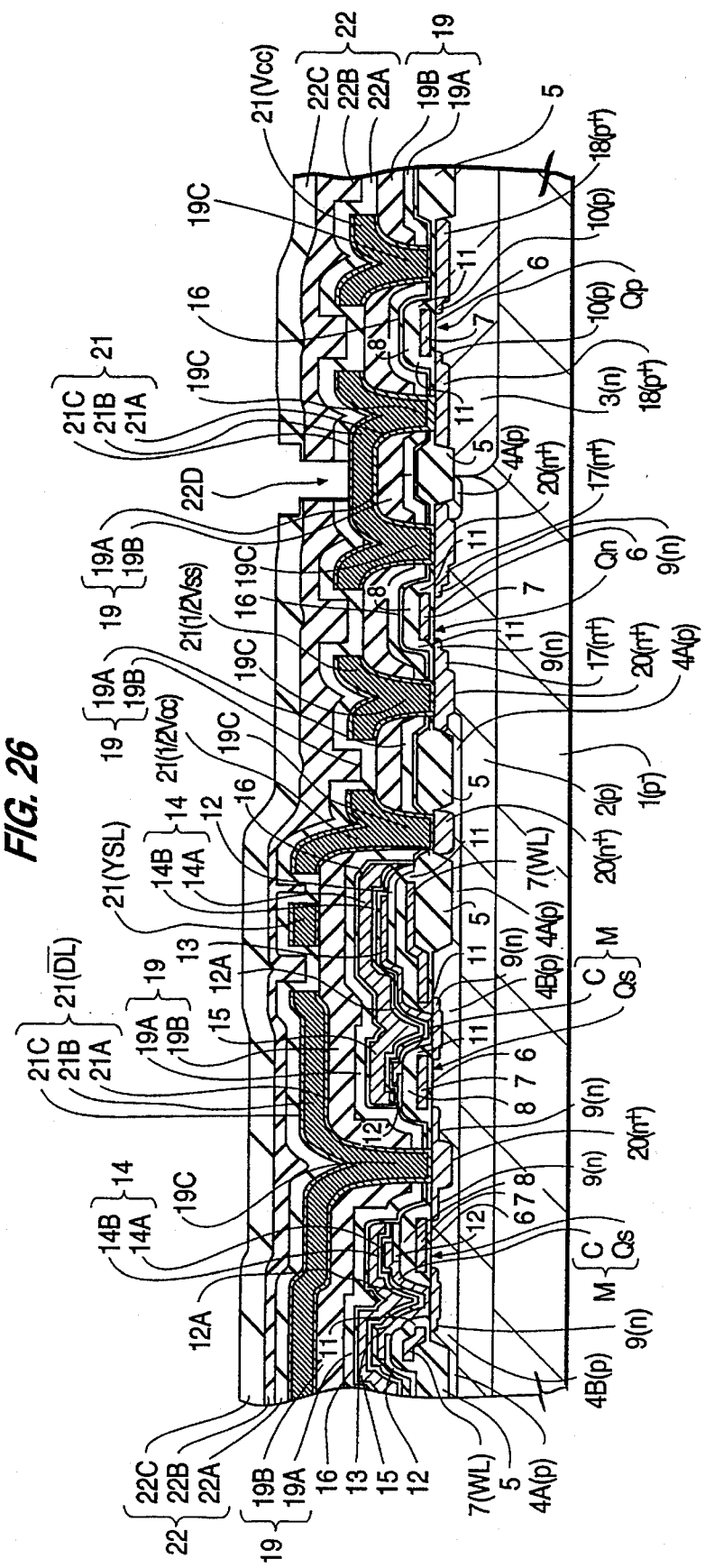

Subsequently, as illustrated in FIG. 26, a contact hole 22D is formed in the inter-layer insulator film 22. The contact hole 22D is formed into a stair shape in vertical section by a resist retraction method which employs a multilayer photoresist film (etching mask) and anisotropic etching such as RIE. A method for forming the contact hole with a stair shape is described in U.S. patent application Ser. No. 117,855, filed Nov. 6, 1987, the contents of which, in its entirety, have previously been incorporated herein by reference. Thereafter, annealing at about 400° C. is performed in order to remedy damages ascribable to the etching.

Subsequently, as illustrated in FIGS. 2 and 3, wiring 23 which extends on the inter-layer insulator film 22 and which is formed by the step of forming the second layer of wiring is formed so as to connect to the wiring 21 through the contact hole 22D. As stated before, the wiring 23 is constructed of a triple-layer structure, corresponding to wiring 21, in which an underlying film 23A and an aluminum film 23B are successively stacked, with a protective film 23C (refractory metal silicide, having a silicon content greater than 0 and less than 2, preferably greater than 0 and at most 1.2) stacked on the aluminum film 23B.

The underlying film 23A of the lower layer is formed of $MoSi_2$ deposited by sputtering, and to a thickness of about 100–1000 521 .

The aluminum film 23B of the upper layer is deposited by sputtering, and it is formed to a thickness of about 7000–12000 Å, which is greater than the thickness of the aluminum film 21B of the wiring 21. Likewise to the aluminum film 21B, the aluminum film 23B is doped with both Cu and Si in equal amounts.

Similarly to protective film 21C, protective film 23C is made of $MoSi_x$ ($0<x<1.2$), and is formed to a thickness of about 100–1000 Å. This protective film 23C protects the surface of aluminum film 23B from a liquid which is used in the wet process for forming wiring 23.

In this manner, the protective film 21C (refractory metal silicide film, which is of $MoSi_x$ in the present embodiment, having a silicon content greater than 0 and less than 2 (the optimum value being greater than 0 and at most 1.2)) is interposed between that aluminum film 21B of the wiring 21 which is doped with the element (Cu) for reducing migration and that aluminum film 23B of the wiring 23 which is connected to the aluminum film 21B through the contact hole 22D formed in the inter-layer insulator film 22. Due to such protective film 21C, the grains of the aluminum film 21B of the wiring 21 can be prevented from precipitating at the boundary of the protective film 21C and the aluminum film 23B (through the protective film 21C) and forming an aluminum oxide, so that the contact resistance between the aluminum film 21B and the aluminum film 23B can be lowered. As a result, the available percentage concerning the connected parts of the wiring 21 and the wiring 23 can be increased.

Moreover, since the contact resistance between the wiring 21 and 23 can be reduced, the speed of signal transmission can be increased, and the operating speed of the DRAM can be increased.

After the step of forming the wiring 23, annealing is carried out in order to remedy damages ascribable to etching (anisotropic etching) for forming the wiring 23.

Subsequently, a passivation film (not shown) is formed on the whole surface of the substrate including the wiring 23.

The DRAM of the present embodiment is substantially finished up by performing these series of steps.

Although, in the above, the various aspects of the present invention made by the inventors, have been concretely described in conjunction with the embodiment, it is a matter of course that the present invention is not restricted to the foregoing embodiment, but that it can be variously altered within a scope not departing from the purport thereof.

For example, the various aspects of the present invention are not limited to DRAMs, but can be directed to other structure, including other semiconductor structure, having wiring (e.g., multi-level wiring), and/or having capacitor elements. Again, it is emphasized that the present invention is particularly advantageous for microminiature structure, for increasing charge contained in storage in a capacitor element.

Furthermore, while the foregoing embodiment describes the impurity flux for forming source/drain regions of MISFET $Q_n$ as on the order to $10^{15}$ atoms/cm$^2$ (an impurity concentration of $10^{20}$ atoms/cm$^3$), the impurity flux (concentration) can be greater than such value. Generally, the impurity flux for source/drain regions of MISFET $Q_n$ is greater than $10^{14}$ atoms/cm$^2$ (the impurity concentration of such regions being greater than $10^{19}$ atoms/cm$^3$), which is the preferred maximum for the impurity region of the MISFET $Q_s$ to which the information storing capacitor is connected.

Moreover, while the foregoing embodiment describes aluminum wiring layers of aluminum —1.5 wt. % Si—0.5 wt. % Cu, the wiring layers can include 0–1.5 wt. % Si and 0–2.0 wt. % Cu. Moreover, other alloy systems which can be used for the aluminum wiring include Al—Ti—Si and Al—Pd—Si.

Furthermore, the sixth aspect of the present invention, wherein stacked layers (e.g., stacked wiring layers) are formed without breaking the vacuum, can be used with deposition techniques other than sputtering; for example, a chemical vapor deposition (CVD) technique can be used. However, it is difficult to form stacked wiring layers according to the embodiment of the present invention by CVD technique, due to the difficulties in depositing aluminum by CVD. Therefore, use of sputtering in accordance with the sixth aspect of the present invention, to provide wiring layers and sub-layers according to the embodiment of the present invention, is preferred.

The various aspects of the present invention have advantageous effects as set forth in the following paragraphs.

Thus, by the first aspect of the present invention, by forming at least the semiconductor region of the memory cell selecting MISFET by ion implantation at a lower concentration flux than that of MISFETs of the peripheral circuit, providing the semiconductor regions of the memory cell selecting MISFET with a lower impurity concentration than that of MISFETs of the peripheral circuit, the refresh characteristics can be enhanced, and hence a higher operating speed can be achieved.

In addition, by various other aspects of the present invention, including the overlap of the Y-select line with the capacitor electrode of the stacked capacitor element, providing the dielectric of the storage capacitor to have the same shape as the upper capacitor electrode, and providing the dielectric of the capacitor as stacked silicon nitride/silicon oxide films, with the silicon oxide being formed by subjecting the silicon nitride layer to high-pressure oxidation, the charge holding characteristics of the capacity, particularly when utilized as the information storing element of a DRAM, can be improved. In addition, the operating speed of the DRAM can be improved, and the number of steps required for fabricating the DRAM can be reduced. Furthermore, the breakdown strength of the dielectric film, and accordingly the electric reliability of the semiconductor integrated circuit can be improved; such improvement according to the present invention is particularly desirable in a DRAM having a memory cell constructed of an information storing capacitor element of stacked structure.

In addition, by the sixth and seventh aspects of the present invention, the wiring can be reliably etched, due to avoidance of an oxide film between the first and second metal layers by forming the second metal wiring on the first metal wiring without removal of the vacuum between depositing of the two layers; and, by utilizing the MoSi$_x$ layer as an inter-layer between upper and lower wirings, the contact resistance value between the lower and upper wiring layers can be reduced, and a defect in the shape of the wiring and disconnection of the wiring resulting from a galvanic reaction can be prevented, so that the electrical reliability of the wiring can be improved.

While we have shown and described a specific embodiment in connection with all of the various aspects of the present invention, it is to be understood that the present invention, in all of its aspects, is not limited to such embodiment, but is susceptible of numerous changes and modifications as are known to one having ordinary skill in the art; and we therefore do not wish to be limited to the details shown and described herein, but intend to cover all such modifications as are encompassed by the scope of the appended claims.

We claim:

1. A method of manufacturing a semiconductor integrated circuit device having (1) memory cells each comprising a first MISFET and a capacitor element connected in series and (2) a peripheral circuit comprising second MISFETs, comprising the steps of:

providing a semiconductor substrate having a main surface of first conductivity type, said main surface including a first area for forming one of said memory cells and a second area for forming one of said second MISFETs;

forming a first conductive strip, having two sides, both said two sides overlying said first area, as a gate electrode for said first MISFET, and forming a second conductive strip, having two sides, both said two sides overlying said second area as a gate electrode for a second MISFET;

introducing first impurities of second conductivity type, which is opposite to said first conductivity type, into said semiconductor substrate in said first and second areas, in a self-aligned manner with said first and second conductive strips, thereby to form first semiconductor regions as source and drain regions for said first MISFET in said first area and second semiconductor regions in said second area as source and drain regions for said second MISFET;

selectively forming sidewall spacers on both sides of each of said first and second conductive strips;

forming a first insulating film over said first and second conductive strips in said first and second areas, said first insulating film having a via exposing said sidewall spacers on sides of said first conductive strips and exposing a surface portion of said semiconductor substrate into which said first impurities have been introduced in said first area;

forming a first polycrystalline silicon strip in said via so that said first polycrystalline silicon strip contacts said surface portion in said first area;

forming a dielectric film over said first polycrystalline silicon strip and forming a third conductive strip over said dielectric film; and introducing second impurities of second conductivity type into said semiconductor substrate in said second area in a self-aligned manner with said sidewall spacers, on both sides of said second conductive strip, without introducing said second impurities in said first area, thereby to form third semiconductor regions as source and drain regions of said second MISFET, wherein said step of introducing second impurities is performed using second impurities having higher impurity concentration than said first impurities so as to form said third semiconductor regions having a higher impurity concentration than that of said first semiconductor regions.

2. A method of manufacturing a semiconductor integrated circuit device according to claim 1, further comprising a step of forming a mask layer covering said first area and exposing said second area, prior to said introducing second impurities, said mask layer acting as a mask when introducing the second impurities.

3. A method of manufacturing a semiconductor integrated circuit device according to claim 1, wherein said step of forming sidewall spacers comprises the substeps of:

forming an insulating film over said first and second conductive strips; and etching said insulating film by using reactive ion etching.

4. A method of manufacturing a semiconductor integrated circuit device according to claim 1, further comprising a step of forming a fourth conductive strip in said first area, said fourth conductive strip being connected to another of said source and drain regions of said first MISFET.

5. A method of manufacturing a semiconductor integrated circuit device according to claim 4, further comprising a step of forming fifth conductive strips in said second area, said fifth conductive strips being connected to said source and drain regions of said second MISFET.

6. A method of manufacturing a semiconductor integrated circuit device according to claim 1, wherein the first polycrystalline silicon film is formed in a self-aligned manner in contact with said surface portion exposed in said via.

7. A method of manufacturing a semiconductor integrated circuit device according to claim 1, further comprising the step of introducing third impurities of the second conductivity type in said surface portion so as to form a fourth semiconductor region in one of said first semiconductor regions, the fourth semiconductor region having a higher impurity concentration than said one of the first semiconductor regions.

8. A method of manufacturing a semiconductor integrated circuit device according to claim 7, wherein said third impurities are introduced in said surface portion by diffusion from the first polycrystalline silicon strip, the third impurities having been included in the first polycrystalline silicon strip.

9. A method of manufacturing a semiconductor integrated circuit device according to claim 7, wherein the impurity concentration of the fourth semiconductor region is less than an impurity concentration of the third semiconductor regions.

10. A method of manufacturing a semiconductor integrated circuit device according to claim 7, wherein a depth of the fourth semiconductor region from the main surface of the semiconductor substrate is less than that of the first semiconductor regions.

11. A method of manufacturing a semiconductor integrated circuit device according to claim 1, wherein said first polycrystalline silicon strip is a conductive strip having said third impurities therein.

12. A method of manufacturing a semiconductor integrated circuit device according to claim 1, wherein the first polycrystalline silicon strip contacts with one of the first semiconductor regions, and wherein the method includes the further step of forming a conductive line connected with another of the first semiconductor regions, the further step of forming the conductive line including substeps of:

forming a fifth semiconductor region in said another of the first semiconductor regions, the fifth semiconductor region being of a same conductivity type as that of the first semiconductor regions and of a higher impurity concentration than that of the first semiconductor regions; and forming the conductive line so as to contact the fifth semiconductor region.

13. A method of manufacturing a semiconductor integrated circuit device according to claim 12, wherein the fifth semiconductor region is formed by introducing impurities into said another of the first semiconductor regions via a contact hole exposing said another of the first semiconductor regions, and wherein the conductive line is formed so as to extend into said contact hole.

14. A method of manufacturing a semiconductor integrated circuit device according to claim 13, wherein the impurities are introduced into said another of the first semiconductor regions, to form the fifth semiconductor region, by ion implantation.

15. A method of manufacturing a semiconductor integrated circuit device according to claim 12, wherein, prior to forming the conductive line, an inter-layer insulating film is selectively removed so as to expose the semiconductor substrate at the fifth semiconductor region, the inter-layer insulating film being selectively removed using the third conductive strip as a mask.

16. A process for forming a first MISFET and second MISFETs of a semiconductor integrated circuit device having (1) memory cells each comprising the first MISFET and a capacitor element connected in series and (2) a peripheral circuit comprising the second MISFETs, comprising the steps of:

providing a semiconductor substrate having a main surface of a first conductivity type, said main surface including a first area for forming one of said memory cells and a second area for forming a second MISFET of said second MISFETs;

forming a first conductive strip, having two sides, both said two sides overlying said first area, as a gate electrode for said first MISFET, and forming a second conductive strip, having two sides, both said two sides of said second conductive strip overlying said second area, as a gate electrode for said second MISFET;

introducing first impurities of a second conductivity type, which is opposite to said first conductivity type, into said semiconductor substrate in said first and second areas, in a self-aligned manner with said first and second conductive strips, thereby to form first semiconductor regions as source and drain regions for said first MISFET in said first area, and second semiconductor regions in said second area;

selectively forming sidewall spacers on both sides of each of said first and second conductive strips;

forming a first insulating film over said first and second conductive strips in said first and second areas, said first insulating film having a via exposing said sidewall spacers formed on said first conductive strip and exposing a surface portion of said semiconductor substrate into which said first impurities have been introduced in said first area;

forming a first polycrystalline silicon strip in said via so that said first polycrystalline silicon strip contacts with said surface portion in said first area;

forming a mask layer which covers said first area and exposes said second area; and introducing second impurities of the second conductivity type into said semiconductor substrate in said second area in self-aligned manner with said sidewall spacers, on both sides of said second conductive strip, by using said mask layer as a mask, thereby to form third semiconductor regions as source and drain regions of said second MISFET, wherein said step of introducing second impurities is performed using second impurities having higher impurity concentration than said first impurities, such that the third semiconductor regions have a higher impurity concentration than that of said first semiconductor regions.

17. A process according to claim 16, further comprising the step of introducing third impurities of the second conductivity type in said surface portion so as to form a fourth semiconductor region in one of said first semiconductor regions, the fourth semiconductor region having a higher impurity concentration than said one of the first semiconductor regions.

18. A process according to claim 17, wherein said third impurities are introduced in said surface portion by diffusion from the first polycrystalline silicon strip, the third impurities having been included in the first polycrystalline silicon strip.

19. A process according to claim 18, wherein said first polycrystalline silicon strip is connected to said capacitor element.

20. A process according to claim 17, wherein the impurity concentration of the fourth semiconductor region is less than an impurity concentration of the third semiconductor regions.

21. A process according to claim 17, wherein a depth of the fourth semiconductor region from the main surface of the semiconductor substrate is less than that of the first semiconductor regions.

22. A process according to claim 16, wherein the first polycrystalline silicon strip contacts with one of the first semiconductor regions, and wherein the method includes the further step of forming a conductive line connected with another of the first semiconductor regions, the further step of forming the conductive line including substeps of:

forming a fifth semiconductor region in said another of the first semiconductor regions, the fifth semiconductor region being of a same conductivity type as that of the first semiconductor regions and of a higher impurity concentration than that of the first semiconductor regions; and forming the conductive line so as to contact the fifth semiconductor region.

23. A process according to claim 22, wherein the fifth semiconductor region is formed by introducing impurities into said another of the first semiconductor regions via a contact hole exposing said another of the first semiconductor regions, and wherein the conductive line is formed so as to extend into said contact hole.

* * * * *